(12) United States Patent
Aparicio, IV

(10) Patent No.: US 7,657,496 B2
(45) Date of Patent: Feb. 2, 2010

(54) NONLINEAR ASSOCIATIVE MEMORIES USING LINEAR ARRAYS OF ASSOCIATIVE MEMORY CELLS, AND METHODS OF OPERATING SAME

(75) Inventor: Manuel Aparicio, IV, Chapel Hill, NC (US)

(73) Assignee: Saffron Technology, Inc., Morrisville, NC (US)

( * ) Notice: Subject to any disclaimer, the term of this patent is extended or adjusted under 35 U.S.C. 154(b) by 391 days.

(21) Appl. No.: 11/426,520

(22) Filed: Jun. 26, 2006

(65) Prior Publication Data

US 2007/0299797 A1    Dec. 27, 2007

(51) Int. Cl.
*G06F 7/00* (2006.01)
(52) U.S. Cl. .............................. 706/26; 706/15; 706/16; 711/128
(58) Field of Classification Search ............. 706/15–22, 706/26; 711/128
See application file for complete search history.

(56) References Cited

U.S. PATENT DOCUMENTS

| | | | |
|---|---|---|---|
| 4,660,166 A | | 4/1987 | Hopfield |
| 5,073,867 A | | 12/1991 | Murphy et al. |
| 5,103,405 A | | 4/1992 | Murphy et al. |
| 5,487,133 A | | 1/1996 | Park et al. |
| 5,515,477 A | * | 5/1996 | Sutherland .................... 706/41 |
| 5,619,709 A | | 4/1997 | Caid et al. |
| 5,719,955 A | | 2/1998 | Mita |
| 5,822,608 A | * | 10/1998 | Dieffenderfer et al. ........ 712/20 |
| 5,870,729 A | | 2/1999 | Yoda |
| 5,943,670 A | | 8/1999 | Prager |

(Continued)

FOREIGN PATENT DOCUMENTS

EP    0 461 902 A2    12/1991

OTHER PUBLICATIONS

Notification of Transmittal of The International Search Report and the Written Opinion of the International Searching Authority, or the Declaration, International Search Report, Written Opinion of the International Searching Authority, PCT/US2007/014672, Mar. 26, 2008.

(Continued)

*Primary Examiner*—David R Vincent
*Assistant Examiner*—Omar F Fernandez Rivas
(74) *Attorney, Agent, or Firm*—Myers Bigel Sibley & Sajovec

(57) ABSTRACT

Associative memories include associative memory cells. A respective cell includes a sensor input, a prior association representation, a next association representation and an associative output. The cells are serially interconnected to form a linear array, such that the sensor inputs, the prior association representations and the next association representations of the serially connected cells are arranged in a sequence from distal to proximal cells based on affinities of associations among the series of sensor inputs. A respective cell also includes processing logic. The processing logic is responsive to the associated sensor input being active, to send a measure of the next association representation to an adjacent proximal cell and/or to send a measure of prior association representation to an adjacent distal cell. The processing logic may be further responsive to the associated sensor input being active, and to receipt of the measure of the next association representation from an adjacent distal cell, to accumulate an associative count in the associative output.

35 Claims, 26 Drawing Sheets

U.S. PATENT DOCUMENTS

| | | | |
|---|---|---|---|
| 6,052,679 | A | 4/2000 | Aparicio, IV et al. |
| 6,191,969 | B1 | 2/2001 | Pereira |
| 6,243,490 | B1 | 6/2001 | Mita |
| 6,581,049 | B1* | 6/2003 | Aparicio et al. ............... 706/39 |
| 7,016,886 | B2* | 3/2006 | Cabana et al. ................ 706/39 |
| 7,512,571 | B2* | 3/2009 | Rudolf ......................... 706/14 |
| 2004/0049630 | A1* | 3/2004 | Stark ........................... 711/108 |
| 2004/0170172 | A1* | 9/2004 | Pullela et al. ............... 370/392 |
| 2004/0199724 | A1 | 10/2004 | Jalowiecki et al. |
| 2005/0049984 | A1 | 3/2005 | King |
| 2007/0033346 | A1* | 2/2007 | Lemen et al. ............... 711/128 |

OTHER PUBLICATIONS

Boahen, "Neuromorphic Microchips", *Scientific American*, vol. 292, Issue 5, May 2005, pp. 56-63.

Capell et al., "Drugs Get Smart", *BusinessWeek*, Sep. 5, 2005, pp. 76, 78-79, 82-85.

Cybula Ltd., "AURA Universal Pattern Matching Technology for Multiple Data Types", 2004 V2, pp. 1-15.

Eick et al., "Transformation Algorithms for Data Streams", *Aerospace, 2005 IEEE Conference*, Mar. 5-10, 2005, pp. 1-10.

Freeman et al., "AICP: AURA Intelligent Co-processor for Binary Neural Networks", *IP/SOC 2004*, Dec. 8-9, 2004, pp. 1-6.

Häusser et al., "Dendrites: bug or feature?", *Current Opinion in Neurobiology*, 13:372-383 (2003).

Johnson et al., "Compressing Large Boolean Matrices Using Reordering Techniques", *Proceedings of the 30$^{th}$ VLDB Conference*, Toronto, CA, 2004, pp. 13-23.

Koch et al., "The role of single neurons in information processing", *nature neuroscience supplement*, vol. 3, Nov. 2000, pp. 1171-1177.

Lockheed Martin, "Cognitive Computing".

London et al., "Dendritic Computation", *Annual Review of Neuroscience*, vol. 28, 2005, pp. 530-532.

Martinez et al., "Workshop on Research Directions in Architectures and Systems for Cognitive Processing", Jul. 14-15, 2005, 9 pp.

*Report: IBM's Memory Agent*, Intelligence in Industry, vol. 8, No. 1, Jan. 1999, pp. 5-9.

Segev et al., "Untangling Dendrites With Quantitative Models", *Science*, vol. 290, Oct. 27, 2000, pp. 744-750.

Softky, "Sub-Millisecond Coincidence Detection in Active Dendritic Trees", *Neuroscience*, Vo. 58, No. 1, 1994, pp. 13-41.

*That's Not How My Brain Works*, Technology Review, vol. 102, No. 4, Jul./Aug. 1999, pp. 76-79.

Washington University in St. Louis, "The Field-programmable Port Extender (FPX)".

International Search Report and Written Opinion for PCT/US2007/014672; date of mailing Jan. 15, 2009.

* cited by examiner

NONLINEAR ASSOCIATIVE MEMORIES USING LINEAR ARRAYS OF ASSOCIATIVE MEMORY CELLS, AND METHODS OF OPERATING SAME

FEDERALLY SPONSORED RESEARCH

This invention was made at least in part with Government support under Air Force Research Laboratory Contract No. FAS750-05-C-0125. The Government may have certain rights to this invention.

FIELD OF THE INVENTION

This invention relates to artificial intelligence systems and methods, and more particularly to associative memories and methods of operating same.

BACKGROUND OF THE INVENTION

Associative memories, also referred to as content addressable memories, are widely used in the fields of pattern matching and identification, expert systems and artificial intelligence. Associative memories have been researched extensively and are being marketed commercially. Unfortunately, however, there is a fundamental scaling problem that may limit the use of associative memories to solve real world problems. In particular, conventional linear associative memories may have inputs that do not associate with each other, which can severely limit the ability of such memories to learn and represent possible nonlinearities, such as interactions among the inputs. Moreover, nonlinear memories may be difficult to scale for real world applications, due to the explosion of weights that is provided between all inputs. This geometric scaling generally is unreasonable to support applications at the scale of complexity that warrants such technology.

The geometric scaling of nonlinear associative memories may also make it increasingly difficult to realize these memories in hardware. In particular, hardware realizations may be more amenable to high speed, parallel processing. However, the number of interconnections that may be needed among hardware elements of nonlinear associative memories may make hardware realizations impractical for real world applications.

SUMMARY OF THE INVENTION

Associative memories according to some embodiments of the present invention include a plurality of associative memory cells. A respective cell includes a sensor input, a prior association representation, a next association representation and an associative output. The plurality of cells are serially interconnected to form a linear array, such that the sensor inputs, the prior association representations and the next association representations of the serially connected cells are arranged in a sequence from distal to proximal cells based on affinities of associations among the series of sensor inputs.

A respective cell also includes processing logic therein. In some embodiments, the processing logic is responsive to the associated sensor input being active, to send a measure of the next association representation to an adjacent proximal cell and/or to send a measure of prior association representation to an adjacent distal cell. The processing logic may be further responsive to the associated sensor input being active, and to receipt of the measure of the next association representation from an adjacent distal cell, to accumulate an associative count in the associative output. Alternatively, or in addition, the processing logic may be further responsive to the associated sensor being active, to receipt of the measure of the prior association representation for an adjacent proximal cell, and to the next association representation being active, to accumulate an associative count in the associative output.

In other embodiments, the processing logic is further responsive to receipt of the next association representation from an adjacent distal cell and to the prior association representation being active, to decrement the measure of the next association representation that was received and to send the measure of the next association representation that was decremented to the adjacent proximal cell. Alternatively, or in addition, the processing logic may be further responsive to receipt of the prior association representation from an adjacent proximal cell and to the next association representation being active, to decrement the measure of the prior association representation that was received, and to send the measure of the prior association representation that was decremented to the adjacent distal cell.

In still other embodiments, the processing logic is further responsive to the receipt of the measure of the next association representation from an adjacent distal cell, and to the prior association representation being inactive, to send the measure of the association representation that was received to the adjacent proximal cell. Alternatively, or in addition, the processing logic may be further responsive to the receipt of the measure of the prior association representation from an adjacent proximal cell and to the next association representation being inactive, to send the measure of the prior association representation that was received to the adjacent distal cell.

In other embodiments of the invention, an accumulator also is provided that is connected to the associative outputs of the plurality of cells. In still other embodiments, the sensor input, the prior association representation, the next association representation, the associative output, the measure of the next association representation and the measure of the prior association representation are stored in corresponding registers in a respective cell. Moreover, the processing logic may be configured to operate upon a plurality of sensor inputs in a pipelined manner.

In any of the above-described embodiments, the affinities of associations among the series of sensor inputs may be determined by sorting an associative matrix of the sensor inputs by repeatedly swapping inputs, prior association representations and next association representations in the series based upon affinities of associations in the proximal and distal directions. Moreover, affinities of associations may be further determined by extracting bands from the series that has been repeatedly swapped, based on projections, such as maximal projections, fixed length projections and/or longest nonmaximal projections.

Moreover, in any of the above-described embodiments, the prior association representation and the measure of the prior association representation may comprise prior association weights, and the next association representation and the measure of the next association representation may comprise next association weights. In still other embodiments, the prior association representation may comprise a prior association vector, the next association representation may comprise a next association vector, the measure of the prior association representation may comprise a pointer and the measure of next association representation may comprise a pointer. In yet other embodiments, the prior association representation and the measure of the prior association representation may comprise segments of prior associations, and the next association representation and the measure of the next association representation may comprise segments of next associations.

Methods of determining associations using an associative memory that comprises a plurality of associative memory cells that are serially connected in a series from distal to proximal cells to form a linear array also may be provided according to other embodiments of the present invention. In these embodiments, a prior association representation and the next association representation for a respective sensor input for a memory cell is loaded into the respective memory cell, wherein the sensor inputs of the serially connected cells are arranged in a sequence from distal to proximal cells based on affinities of associations among the series of sensor inputs. Predetermined sensor inputs are activated to determine associations therebetween.

In some embodiments, responsive to the associated input being active, a measure of the next association representation is sent to an adjacent proximal cell. Alternatively, or in addition, a measure of the prior association representation is sent to an adjacent distal cell. Moreover, responsive to the associated sensor input being active, and to receipt of the measure of the next association representation from an adjacent distal cell, an associative count is accumulated. Alternatively, or in addition, responsive to the associated sensor input being active, and to receipt of the measure of the prior association representation from the adjacent proximal cell, an associative count is accumulated.

According to other embodiments, responsive to receipt of the next association representation from an adjacent distal cell and to the prior association representation being active, the measure of the next association representation that was received is decremented, and the measure of the next association representation that was decremented is sent to the adjacent proximal cell. Alternatively, or in addition, responsive to receipt of the measure of the prior association representation from the adjacent proximal cell and to the next association representation being active, the measure of the prior association representation that was received is decremented, and the measure of the prior association representation that was decremented is sent to the adjacent distal cell.

In still other embodiments, responsive to receipt of the measure of the next association representation from an adjacent distal cell and to the prior association representation being inactive, the measure of the association representation that was received is sent to the adjacent proximal cell. Alternatively, or in addition, responsive to response of the measure of the prior association representation from an adjacent proximal cell and to the next association representation being inactive, the measure of the prior association representation that was received is sent to the adjacent distal cell.

In some embodiments, the associative counts may be accumulated. Moreover, the predetermined sensor inputs may be activated repeatedly in a pipelined manner.

In some embodiments, inputs, prior association representations and next association representations in the series are repeatedly swapped based upon affinities of associations in the proximal and distal directions to determine the affinities of associations among the series of sensor inputs. Repeatedly swapping may be followed by extracting bands from the series that has been repeatedly swapped based on projections, such as maximal projections, fixed length projections and/or longest nonmaximal projections. Repeatedly swapping and extracting bands may be performed prior to and/or after the loading. As was described above, the association representations and measures thereof may comprise weights, in some embodiments. In other embodiments, the association representations can comprise vectors and the measure of association representations can comprise pointers. In still other embodiments, the association representations and measures thereof may comprise segments of associations.

BRIEF DESCRIPTION OF THE DRAWINGS

FIGS. 15C-15F illustrate results of extraction that use an entire projection, use a fixed length projection, use a contiguous diagonal and use an optimal diagonal, respectively, according to various embodiments of the present invention.

DETAILED DESCRIPTION

Figure 1:
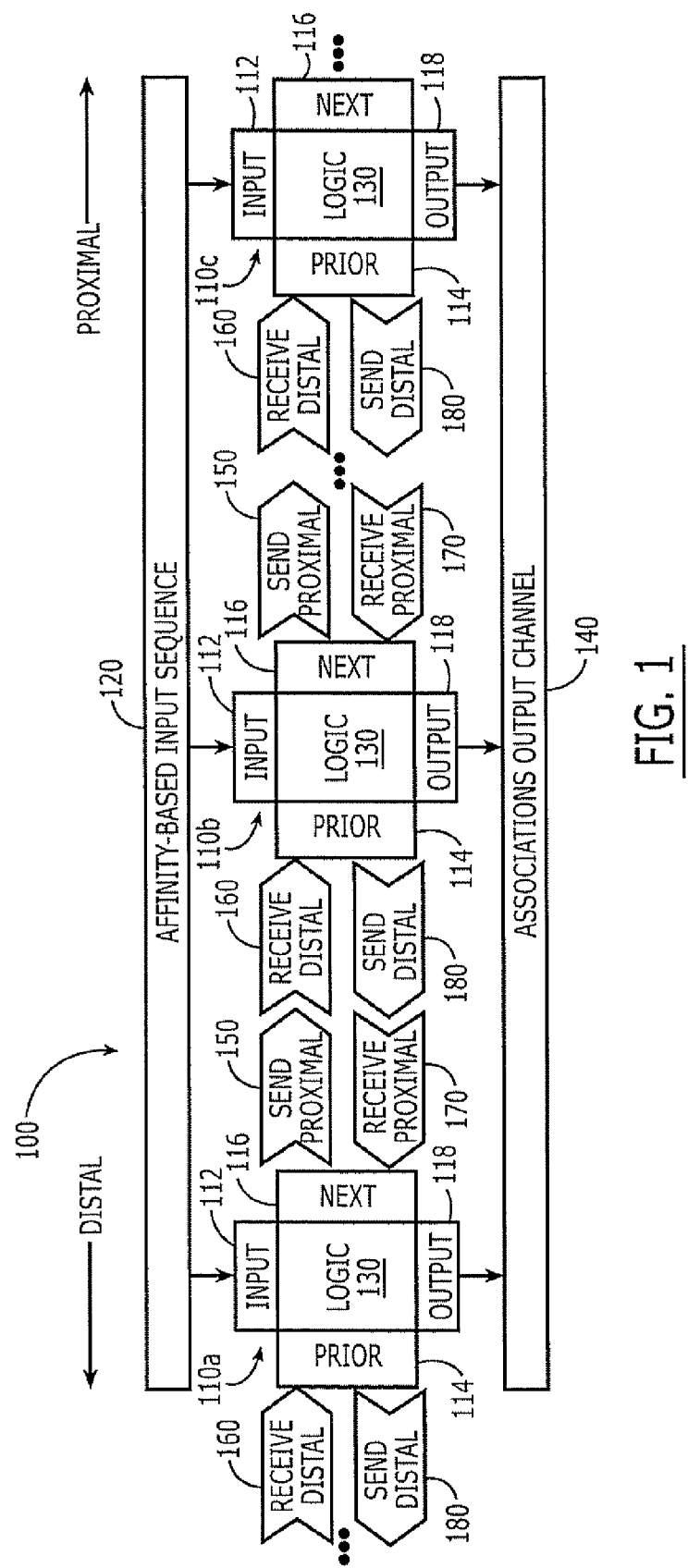
FIG. 1 is a block diagram of an associative memory and operating methods according to some embodiments of the present invention.

The present invention now will be described more fully hereinafter with reference to the accompanying figures, in which embodiments of the invention are shown. This invention may, however, be embodied in many alternate forms and should not be construed as limited to the embodiments set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof. Moreover, when an element is referred to as being "responsive to" or "based on" another element, it can be directly responsive to or directly based on the other element, or intervening elements may be present. In contrast, when an element is referred to as being "directly responsive to" or "directly based on" another element, there are no intervening elements present. In general, the term "directly" means there are no intervening elements/steps, and absence of the term "directly" means there can be intervening elements/steps. As used herein the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first cell could be termed a second cell, and, similarly, a second cell could be termed a first cell without departing from the teachings of the disclosure.

The present invention is described below with reference to block diagrams and/or flowchart illustrations of methods, apparatus (systems and/or devices) and/or computer program products according to embodiments of the invention. It is understood that a block of the block diagrams and/or flowchart illustrations, and combinations of blocks in the block diagrams and/or flowchart illustrations, can be implemented by computer program instructions. These computer program instructions may be provided to a processor of a general purpose computer, special purpose computer, and/or other programmable data processing apparatus to produce a machine, such that the instructions, which execute via the processor of the computer and/or other programmable data processing apparatus, create means (functionality) and/or structure for implementing the functions/acts specified in the block diagrams and/or flowchart block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the block diagrams and/or flowchart block or blocks.

The computer program instructions may also be loaded onto a computer or other programmable data processing apparatus to cause a series of operational steps to be performed on the computer or other programmable apparatus to produce a computer-implemented process such that the instructions which execute on the computer or other programmable apparatus provide steps for implementing the functions/acts specified in the block diagrams and/or flowchart block or blocks.

Accordingly, the present invention may be embodied in hardware and/or in software (including firmware, resident software, micro-code, etc.). Furthermore, the present invention may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated.

Spatially relative terms, such as "top", "bottom", "left", "right" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

The terms "prior" and "next" are used herein to denote rows and columns, respectively, of a triangular auto-associative matrix. Thus, for example, a prior projection accounts for how many bits are in a given row, and a next projection accounts for how many bits are in a given column, of a triangular auto-associative matrix. It will be understood, however, that the row and column designations can be reversed. Moreover, the terms "proximal" and "distal" are used herein to designate opposite directions along a linear array of associative memory cells. In the description to follow, proximal is defined as a succeeding or increasing direction, shown as extending to the right, and distal is defined as a preceding or decreasing direction, shown to the left in the figures. However, again, these relative directions can be reversed in other embodiments.

In order to provide a complete description of embodiments of the present invention, FIGS. 1-6 will provide a high level overview of exemplary embodiments of the present invention. FIGS. 7-25 will then provide a more detailed description including multiple illustrative examples.

FIG. 1 is a block diagram of an associative memory and operating methods according to some embodiments of the present invention. As shown in FIG. 1, these embodiments of an associative memory 100 include a plurality of associative memory cells 110a-110c. Although only three cells 110a-110c are illustrated in FIG. 1 for simplicity, it will be recognized by those having skill in the art that, typically, many more than cells will be provided in an associative memory.

Still referring to FIG. 1, a respective cell 110 includes a sensor input 112, a prior association representation 114, a next association representation 116 and an associative output 118. It will be understood that the term "sensor input" is used to identify input signals that are used to read the associative matrix, regardless of the origin of these input signals. The plurality of cells are serially connected as shown in FIG. 1, to form a linear array, such that the sensor inputs 112, the prior association representations 114 and the next association representations 116 of the serially connected cells are arranged in a sequence 120 from distal to proximal cells based on affinities of associations among the series of sensor inputs 112. Each input 112 may be a register that indicates whether the associated sensor input is active or inactive (on/off). Techniques for sorting or arranging the cells in a sequence from distal to proximal based on affinities of associations among the series of sensor inputs will be described in more detail below.

The prior association representation 114 can be embodied as a register that includes a representation of prior associations, i.e., associations along a row direction of a triangular auto-associative matrix. The prior association representation 114 may be a weight, a vector, a matrix segment and/or another representation, as will be described in detail below. The next association representation 116 may also be embodied as a register that includes therein a representation of next associations, i.e., associations along a column of a triangular auto-associative matrix. The next association representation 116 may be embodied as a weight, a vector, a matrix segment and/or another representation, as will be described in detail below. The outputs 118 are used to accumulate auto-associative counts and may be embodied as a register that provides a counter, as will be described in detail below. The outputs 118 may be coupled to an association output channel 140, to accumulate the counts that are represented in the outputs 118.

Still referring to FIG. 1, a respective cell 110a-110c also includes processing logic 130 therein. The processing logic may be embodied using a logic gate structure, such as a conventional gate array structure, using a microcontroller, a stored program microprocessor and/or using other conventional techniques for embodying processing logic in an integrated circuit.

Figure 2:
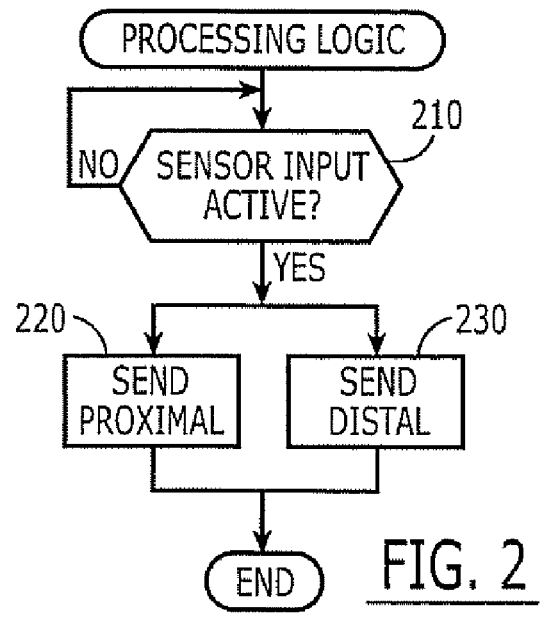
FIGS. 2-5 are flowcharts of operations that may be performed by an associative memory according to some embodiments of the present invention.

FIG. 2 is a flowchart of operations that may be performed by the processing logic, such as the processing logic 130 of FIG. 1, according to some embodiments of the present invention. Referring to FIG. 2, at Block 210, if the associated sensor input, such as the sensor input 112 of FIG. 1, is active, then at Block 220, a measure of the next association representation is sent to an adjacent proximal cell, as also indicated by "send proximal" arrow 150 of FIG. 1. Moreover, at Block 230, a measure of the prior association representation is sent to an adjacent distal cell, as also indicated by "send distal" arrow 180 of FIG. 1. In some embodiments, in response to the sensor input 112 being active, both a representation of the prior association 114 is sent distally (arrow 180) and a representation of the next association 116 is sent proximally (arrow 150), as indicated in FIG. 1. However, in other embodiments, proximal and distal sending need not both be performed. Rather, in some embodiments, only distal sending or only proximal sending may be performed.

Figure 3:
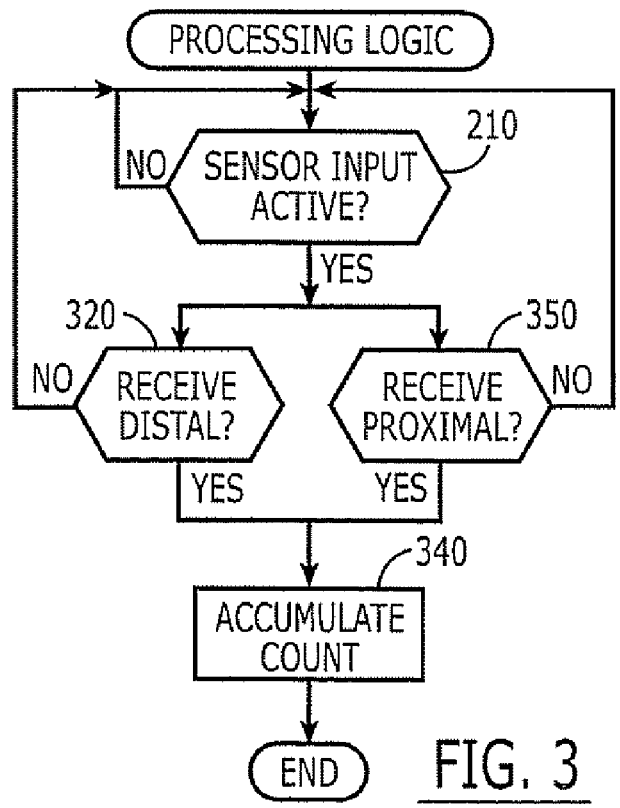

FIG. 3 is a flowchart of other operations that may be performed by processing logic, such as processing logic 130 of FIG. 1, according to other embodiments of the present invention, in addition to the operations that were performed in connection with FIG. 2. The operations of FIG. 3 are responsive to receipt of a signal from an adjacent proximal and/or distal cell 110.

In particular, referring to FIG. 3, if a given sensor input, such as the sensor input 112, is active, at Block 210, and a measure of the next representation is received from an adjacent distal cell at Block 320, as also indicated by arrow 160 of FIG. 1, then an associative count is accumulated at Block 340, for example in the associative output 118. Alternatively, or in addition, in response to the sensor input being active at Block 210, and receipt of the measure of the prior association representation from an adjacent proximal cell at Block 350, as also indicated by arrow 170 of FIG. 1, an associative count is also accumulated at Block 340, for example in the associative output 118. Thus, FIG. 2 illustrates an embodiment of processing that generates the sending of association representations to adjacent proximal and distal cells, and FIG. 3 provides an embodiment of processing that processes representations that are received from distal and proximal cells and accumulates counts.

Figure 4:
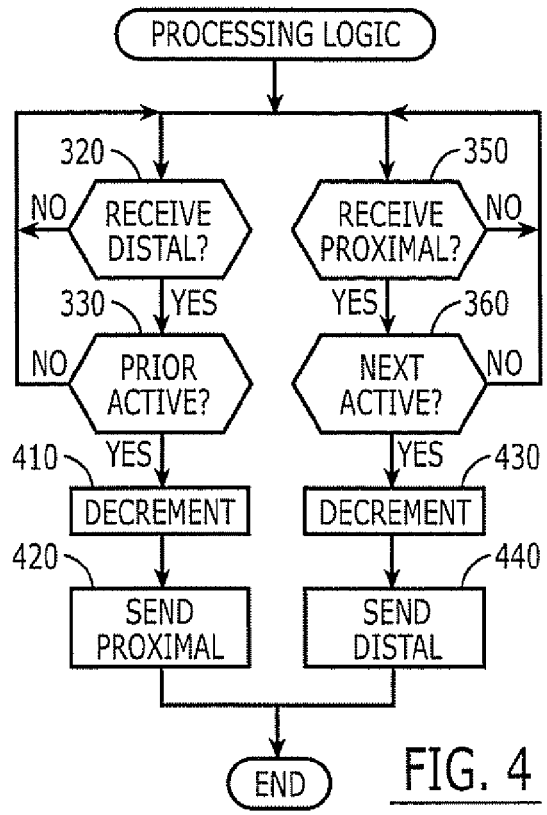

FIG. 4 is a flowchart of additional operations that may be performed by processing logic, such as processing logic 130 of FIG. 1, according to some embodiments of the present invention. These operations may be performed in addition to operations of FIGS. 2 and 3.

In particular, referring to FIG. 4, at Block 320, in response to receipt of the next association representation 116 from an adjacent distal cell, as also indicated by arrow 160 of FIG. 1, and at Block 330, responsive to the prior association representation 114 of a given cell being active, then the measure of the next association representation that was received is decremented, at Block 410, and the measure of the next association representation that was decremented at Block 410 is sent to the adjacent proximal cell at Block 420, as also indicated by arrow 150 of FIG. 1. Alternatively, or in addition, responsive to receipt of the measure of the prior association representation 114 from the adjacent proximal cell at Block 350, as also indicated by arrow 170 of FIG. 1, and further responsive to the next association 116 of the given cell being active at Block 360, the measure of the prior association representation that was received is decremented, at Block 430, and the measure of the prior association representation that was decremented at Block 430 is sent to the adjacent distal cell at Block 440, as also shown by arrow 180 of FIG. 1.

Figure 5:
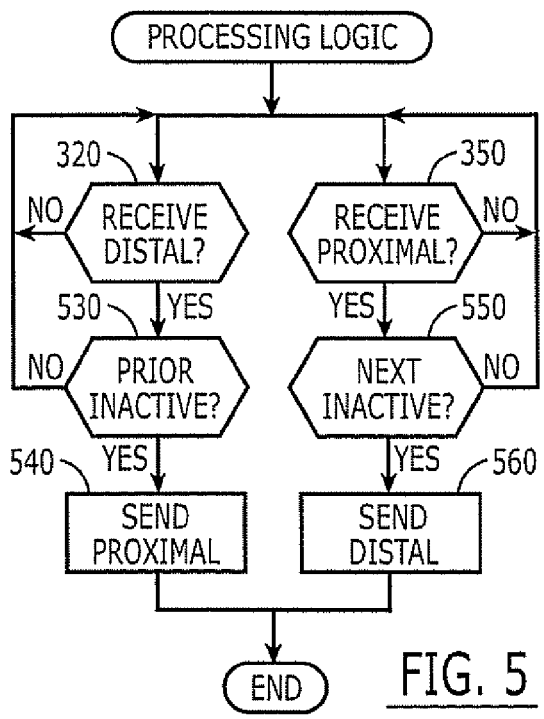

FIG. 5 is a flowchart of still other operations that may be performed by processing logic, such as processing logic 130 of FIG. 1, according to other embodiments of the present invention. These operations may be performed in addition to the operations of FIGS. 2, 3 and 4.

In particular, referring to FIG. 5, at Block 320, in response to receipt of the measure of the next association representation 116 from an adjacent distal cell, as also indicated by arrow 160 of FIG. 1, and further responsive to the prior association representation 114 of the given cell being inactive (no counts or no vector) at Block 530, then the measure of the next association representation that was received is sent to the adjacent proximal cell, as shown in Block 540 and also indicated by arrow 150. In addition, or alternatively, at Block 350, in response to receipt of the measure of the prior association representation 114 from an adjacent proximal cell, as also indicated by arrow 170, and further in response to the next association representation 116 of a given cell being inactive at Block 550, then the measure of the prior association representation that was received by the given cell is sent to the adjacent distal cell at Block 560, as also indicated by arrow 180 of FIG. 1. Accordingly, in these embodiments, if a given cell's prior/next counter is inactive, the received associations are passed along without decrementing. In other embodiments of the invention, however, for example when noncliquish (stringy) projections are employed, the received associations may be passed along after decrementing, whether or not the given cell's prior/next counter is inactive.

Figure 6:
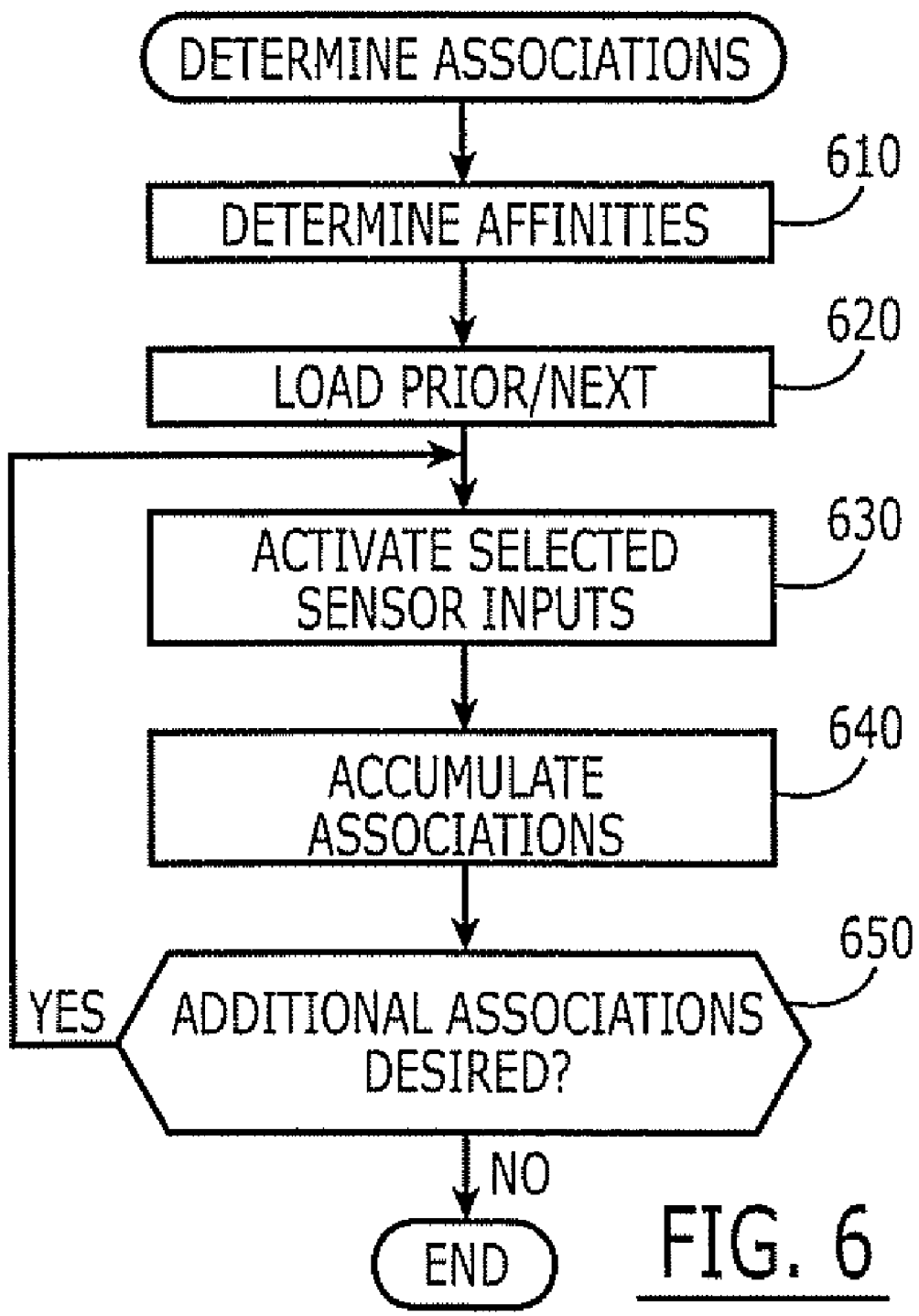
FIG. 6 is a flowchart of operations that may be performed to determine associations according to various embodiments of the present invention.

FIG. 6 is a flowchart of operations that may be performed to determine associations according to various embodiments of the present invention. These operations may be performed using an associative memory that comprises a plurality of associative memory cells that are serially connected in a sequence from distal to proximal cells to form a linear array, such as the associative memory of FIG. 1, and may use operations that were described above in connection with FIGS. 2-5 to determine associations.

In particular, at Block 610, the affinities of associations among the series of sensor inputs are determined to obtain an affinity-based input sequence 120 of FIG. 1. In some embodiments, affinities of associations may be determined prior to loading the associative memory cells at Block 620. In other embodiments, in-place learning may be used to determine affinities after they have been loaded into the memory cells at Block 620. In still other embodiments, the affinities may be determined both prior to and after loading the prior/next representations into the memory cells at Block 620.

In some embodiments, the affinities of associations among the sensor inputs are determined by repeatedly swapping inputs, prior association representations and next association representations in the series, based upon affinities of associations in the proximal and distal directions. Moreover, the affinities of associations among the series of sensor inputs may be further determined by extracting bands from the series that has been repeatedly swapped, based on projections such as maximal projections, fixed length projections and/or longest nonmaximal projections and/or other band extraction techniques. These techniques for determining affinities will be described in detail below. At Block 620, a respective memory cell 110 is loaded with a prior association representation 114 and a next association representation 116 for a respective input sensor 112 of the memory cell, wherein the sensor inputs 112 of the serially-connected cells 110 are arranged in sequence from distal to proximal cells based on the affinities of associations among the series of sensor inputs that were earlier determined and/or are later determined at Block 610. Accordingly, operations of Block 610 and 620 allow a triangular nonlinear auto-associative matrix to be loaded into the linear array of cells 110.

Still referring to FIG. 6, selected sensor inputs are activated to determine associations therebetween, at Block 630. Associations are accumulated in response to the activated sensor inputs at Block 640, for example by performing the processing logic operations of FIGS. 2-5, to thereby send proximal and/or distal signals (FIG. 2) and to operate on proximal and/or distal signals that are received to accumulate counts (FIG. 3), decrement the signals (FIG. 4) and/or pass the signals without decrementing (FIG. 5). The counts may be accumulated in the associations output channel 140, by accumulating the individual outputs 118. Accordingly, operations of Blocks 630 and 640 allow an associative memory to be queried or read by activating selected sensor inputs and accumulating associations.

At Block 650, if it is desired to query for additional associations, then a new set of selected sensor inputs may be activated (Block 630), and new associations may be accumulated (Block 640). It will also be understood by those having skill in the art that the operations of Blocks 630-650 may be performed in a pipelined manner, wherein a new set of sensor inputs are activated at Block 630, while associations are being accumulated for a previously activated set of sensor inputs at Block 640. High speed pipelined operations thereby may be provided.

A more detailed discussion of various embodiments of the present invention now will be provided. Examples also will be used for didactic purposes. In the detailed discussion that follows, a brief discussion of conventional associative memories will be provided, followed by a discussion of techniques for determining affinities of associations according to some embodiments of the invention. Embodiments of associative memories according to some embodiments of the invention will then be described, along with examples. Various embodiments of processing logic according to some embodiments of the invention will be described, along with examples. Finally, embodiments of the invention that use vectors and segments rather than weights will be described along with examples.

Various hardware platforms were investigated as part of underlying research for the present invention. In particular, the Washington University in St. Louis platform and the Cybula/University of York (UK) platform were investigated.

Figure 7:
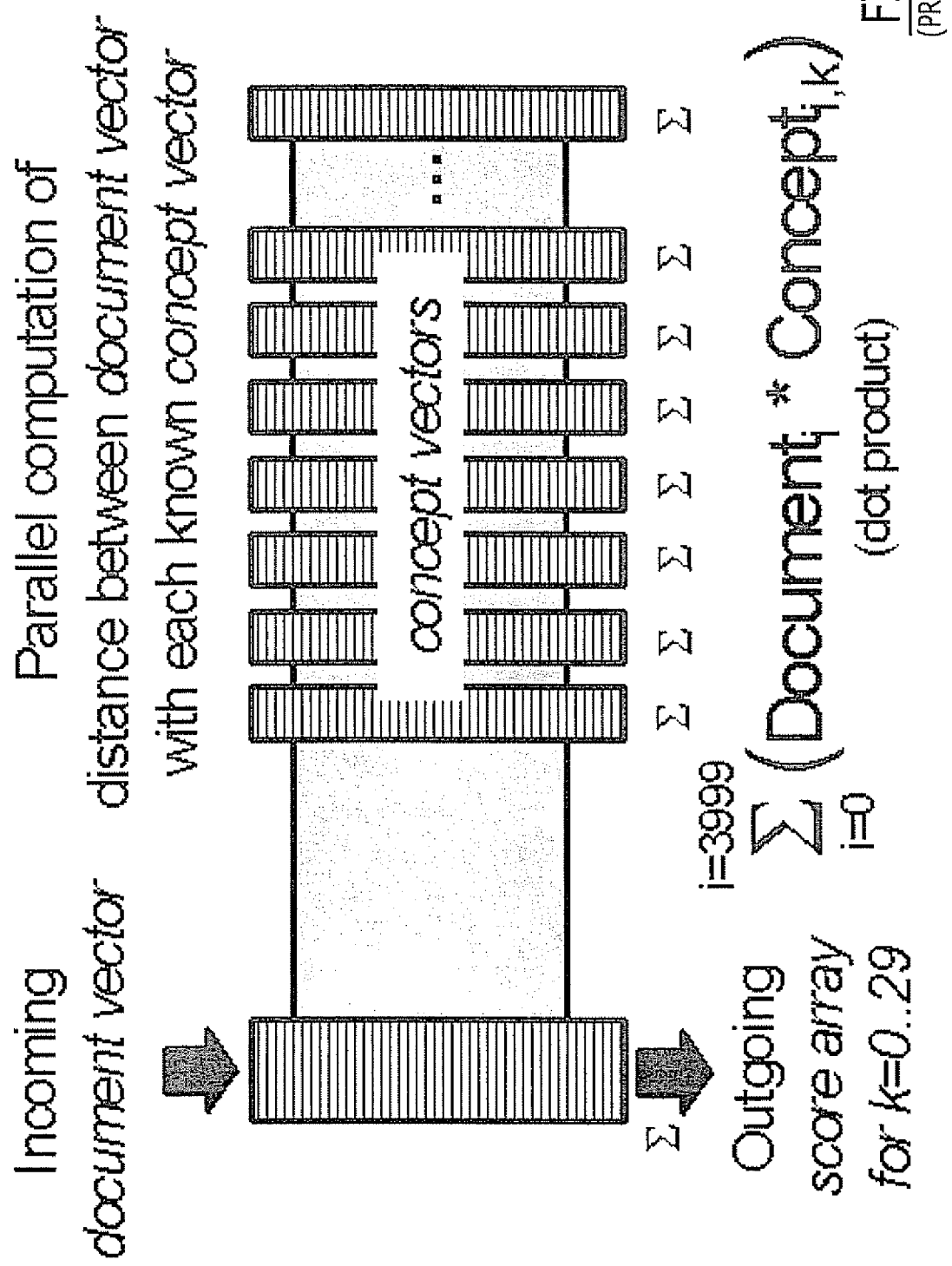
FIG. 7 is a block diagram of a conventional concept vector algorithm using linear dot products.

The Washington University in St. Louis platform is described on the Internet at arl.wustl.edu/projects/fpx/reconfig.htm. Various algorithms already tested with this platform include Latent Semantic Indexing (LSI), Associated Grounded Semantics (AGS), and other standard methods such as K-mean clustering and Order Statistics. In implementing AGS, FIG. 7 shows the use of only "linear" associations because the matrix elements directly map the terms to the concepts.

Each term is trained so as to be represented by its associated terms, but this associated vector of terms is still only a linear predictor of a classification (such as an Internet newsgroup). FIG. 7 is a block diagram that shows how each classification is represented as a "concept vector". The score for each concept is computed by the dot product of the document vector with this concept vector. A dot product represents a linear addition of each index's contribution to the concept. The entire layout can also be seen as a term-to-concept matrix but does not include the non-linear term-to-term information for each concept.

In contrast, some embodiments of the invention can represent non-linear associations for each concept while still maintaining a linear hardware implementation. While a linear method estimates $p(x|y)$, the classification x given each input term y, some embodiments of the invention can also estimate $p(x|y,z)$, the classification x given each y-z pair of input terms. The associations between terms should more accurately model the meaning. At the same time, storing associative pairs without a complete crossbar is a challenge, which may be accomplished by embodiments of the invention.

The Cybula and University of York (UK) platform is described on the Internet at cybula.com. This company is dedicated to the hardware implementation of a particular kind of associative memory. The fundamental representation is a "correlation matrix memory". This memory is only a linear associator and may share the same potential weaknesses as AGS. In the same way as the term-to-concept matrix of AGS, the term-document matrix of Cybula is an explicit and complete crossbar.

The Cybula approach to correlation matrix may also assume a complete crossbar. A term-to-document matrix is used for inverted indexing and retrieval. Associations to these terms are summed as an output vector from one column for each output, either a document index or a concept. While both these approaches may be easy to implement in hardware, such crossbars are generally very inefficient.

Some embodiments of the invention can compress associative memories as a solution to the "crossbar problem", defined as the intersection of all terms within a complete, geometric matrix of all possible associations. "Coincidence detection in thin dendrites" may be thought of as a problem of compression: How can an associative matrix be arranged and decomposed into a set of dominantly linear dendritic structures?

"Coincidence detection" is defined in many ways in the neuroscience literature. The weakest definition is merely given as learning the coincidence firing of the pre-synaptic and post-synaptic neurons. This is known as the Hebbian Rule, in reference to its first mention by Donald Hebb in 1949. However, this does not address how two different synapses on a post-synaptic neuron interact as a coincidence detector. The recent interest and understanding of neurons as nonlinear associators suggests that the computational power of neurons has been under-appreciated and that dendritic structure must relate to some form of "wiring economy". Recent physiologically realistic modeling of coincidence detection has been on the rise, but almost all this work describes how only two neural synapses can interact. In other words, very detailed physiological model and empirical evidence suggests that the neuron is indeed nonlinear in that the activity of one synapse can interact with another, Each neuron is presumed to be a non-linear associator, represented by thin, linear dendrites.

However, the current literature does not appear to address how more than two arbitrary inputs become physically arranged and interact across a thin dendrite in order to produce a meaningful computation. The current literature appears to demonstrate how two synapses can interact for coincidence detection but not how such synapses can become structurally arranged on the dendritic tree in order to represent specific associations. In contrast, some of embodiments of the invention demonstrate both the structural arrangement and the method of coincidence detection across an entire neuron as a means of storing and recalling many non-linear associations.

Figure 8:
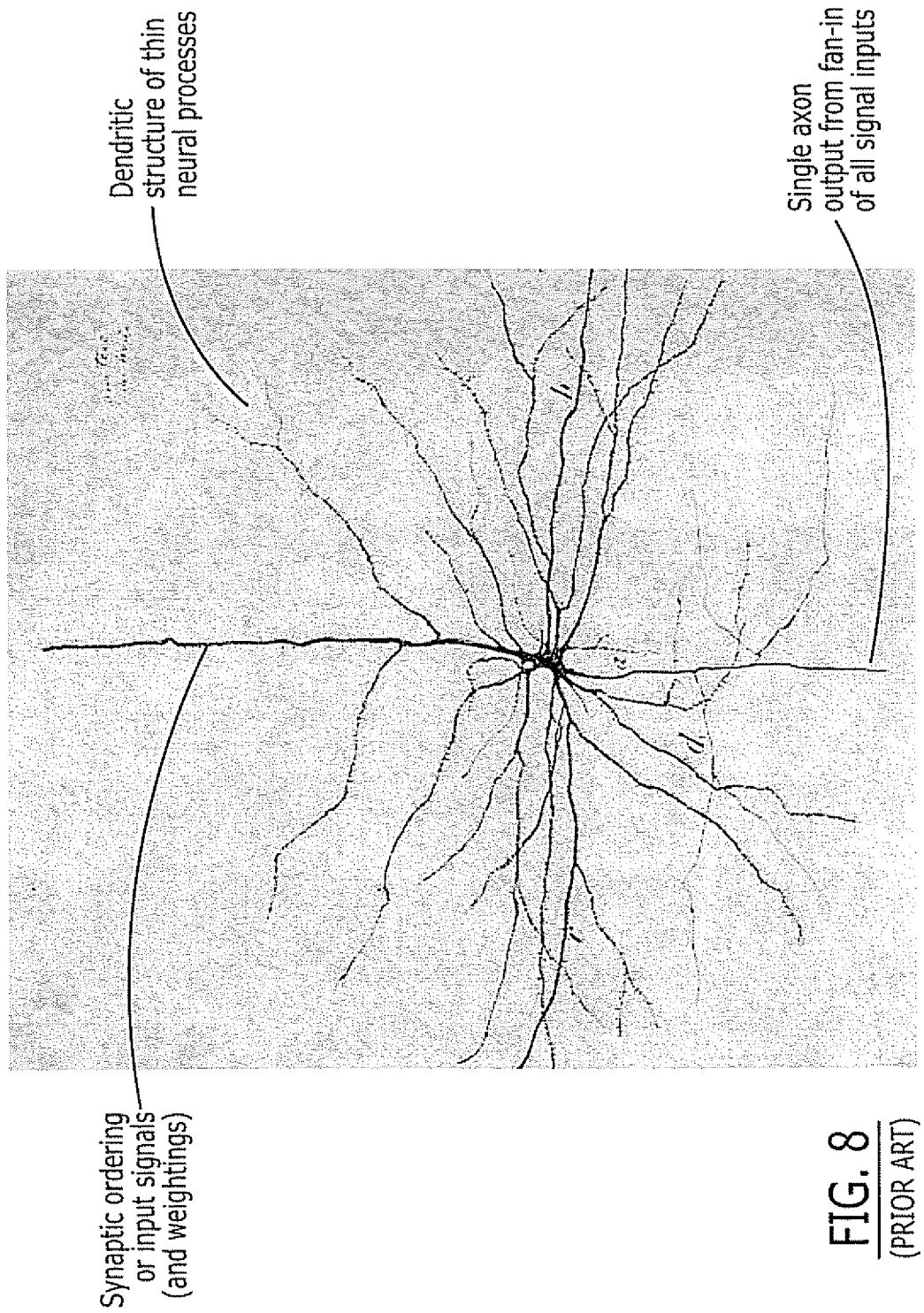
FIG. 8 illustrates a classical neural structure, as first established by Ramon y Cajal at the end of the $19^{th}$ century.

Some embodiments of the invention may be inspired by the classic Neuron Doctrine, first established by Ramon y Cajal at the end of the 19$^{th}$ Century. FIG. 8 illustrates a drawing by Cajal that shows a single neuron, assumed to be the computational unit on neural processing. Input signals are made through synapses, often seen as synaptic "buttons" arranged along the lengths of each dendritic process. The dendrites are long and thin showing the entire neuron a dominantly linear tree. The neuron collects these inputs to compute its output on its single axon. If such collection and computation is non-linear, then the method by which a dominantly linear structure can compute nonlinear associations can be cast as a method of compression.

Techniques for determining affinities of associations in a triangular auto-associative matrix according to some embodiments of the invention now will be described. Determining affinities was described generally at Block 610 of FIG. 6 above and may be used in order to determine a sequence in which the linear array of cells are serially connected, i.e., a sequence of sensor inputs and associated prior association representations and next association representations. As was described generally above, the affinities of associations may be determined by repeatedly swapping inputs, prior association representations and next association representations in the series based upon affinity in the proximal and distal directions. Swapping may then be followed by extracting bands from the series that has been swapped based on projections such as maximal projections, fixed length projections, longest nonmaximal projections and/or other techniques. In other embodiments, bands need not be extracted. These techniques will now be described with detailed didactic examples.

Sorting by maximal projections was described in detail in U.S. Pat. No. 7,016,886 entitled Artificial Neurons Including Weights That Define Maximal Projections, issued Mar. 21, 2006, assigned to the assignee of the present invention, the disclosure of which is hereby incorporated herein by reference in its entirety as if set forth fully herein. As described therein, sorting of matrix projections (the sum of bits for each row, R, and column, C) can pack the bits into zero-start run-length encodings. These projections are linear, one for each row for example. These projections can represent the run lengths in the cases of maximal associative matrices, and can perfectly compute the existence of every bit in the original matrix. It will also be understood that few matrices are maximal, and many contain "switches" in which different arrangements of the bits produce the same projections. In other words, maximal projections are not always invariant to the matrix. The projections cannot exactly determine whether the bits are on or off within the areas of switches. Thus, some swapping of ones and zeros within the switches can be accomplished without changing the projections.

Sorting techniques according to various embodiments of the invention can pack bits into more compressed forms. However, rather than sorting rectangular matrices, auto-associative matrices are triangular and may thereby create different challenges. In particular, the rows and columns of the triangular matrix contain the same term. A goal of sorting is to define one sort order for these terms to use for both rows and columns into a more compressed form. Some embodiments of the invention may sort based on the affinity between terms, which can reduce the number of run lengths and tends to place association bits near the diagonal. Other techniques may use strength of projections for sorting. Moreover, combinations of strength and affinity sortings may also be used.

Figure 9:
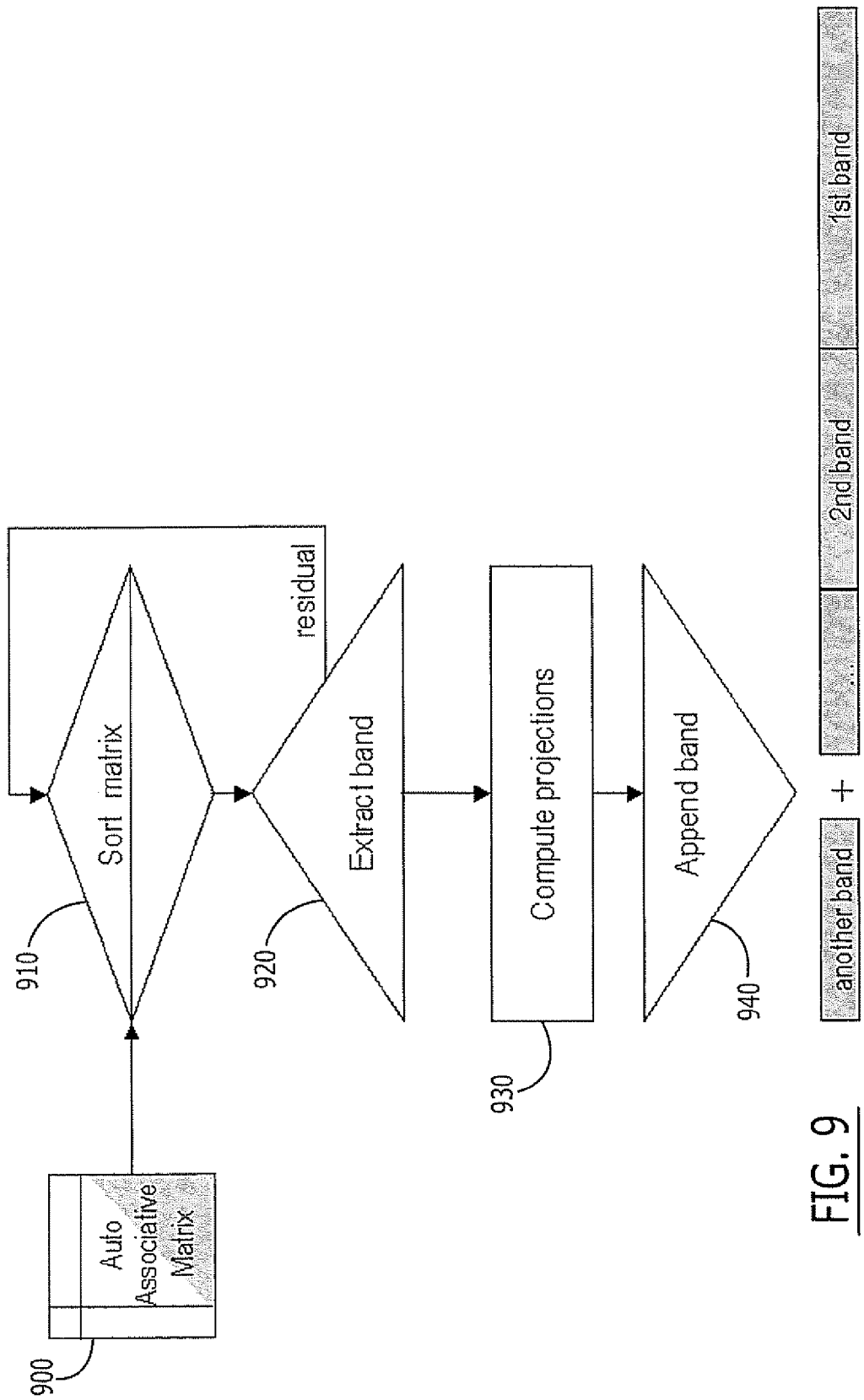
FIG. 9 is a flowchart of operations that may be performed to determine affinities of associations according to various embodiments of the present invention.

FIG. 9 is a flowchart of operations that may be performed to determine affinities of associations according to various embodiments of the invention. At Block 910, a triangular auto-associative matrix 900 is sorted based on affinity, for example using a swapping technique described in detail below. After swapping, bands may be extracted at Block 920. In particular, sorting on the affinity between terms can reduce the number of run lengths and tends to place the association bits nearer the diagonal. Then, band extraction may be performed on the sorted matrix. Once the band has been extracted at Block 920, projections are computed at Block 930 and the bands may then be appended at Block 940.

Affinity sorting may be viewed as a form of matrix band reduction, pushing bits toward the diagonal. Given the original triangular matrix 900, a sort operation of Block 910 reorders terms based on affinity of the terms to each other. Then, a contiguously packed band of bits that lie on the diagonal is extracted at Block 920. This band is defined as being representable by its prior and next projections, which are computed for the extracted band at Block 930. The extraction process of contiguous bits may leave a residual matrix of non-contiguous bits, but this matrix can be sorted again at Block 910 without the first band, which results in a second band and its projections, which can be appended into the continuous form of a growing linear structure, as illustrated at the bottom of FIG. 9.

Figure 10B:
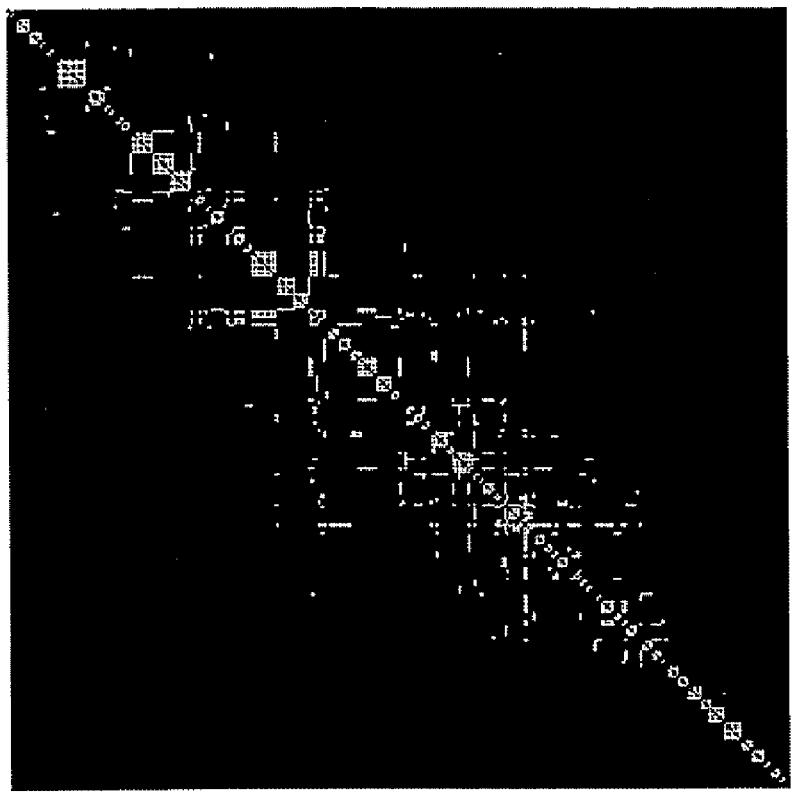
FIGS. 10A and 10B provide an example of an unsorted associative matrix and its organization sorted by affinities, respectively.
Figure 10A:
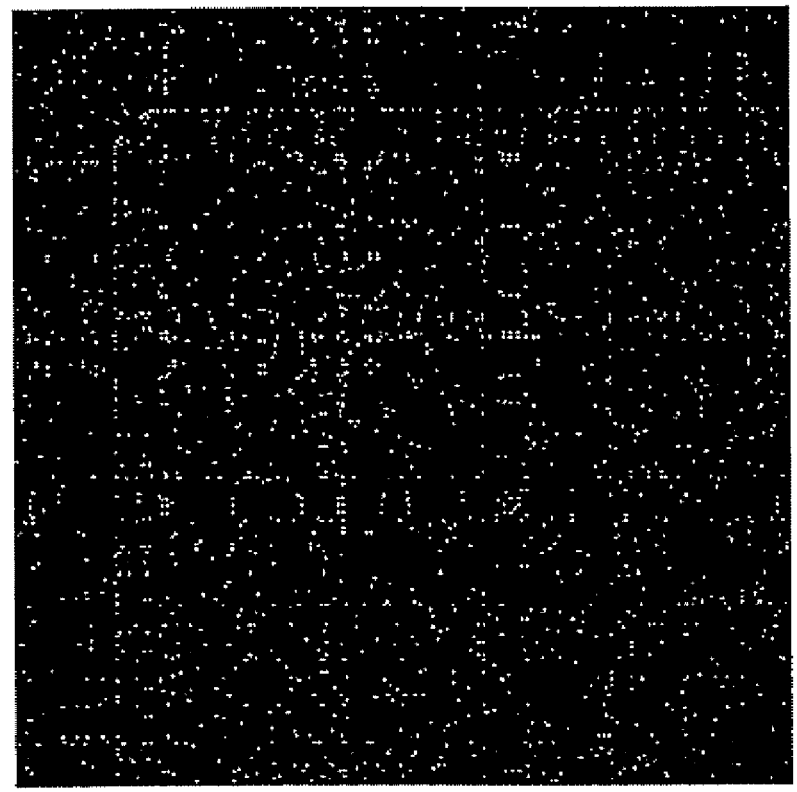

FIGS. 10A and 10B provide an example of an original unsorted matrix and its organization once sorted by term affinities. Note the packing of bits along the diagonal and the degree to which many of the bits are contiguous with each other from the diagonal. It will be understood that FIGS. 11A and 10B show both upper and lower triangles and their symmetry, but only one triangle is needed to represent an auto-associative matrix.

Figure 11B:
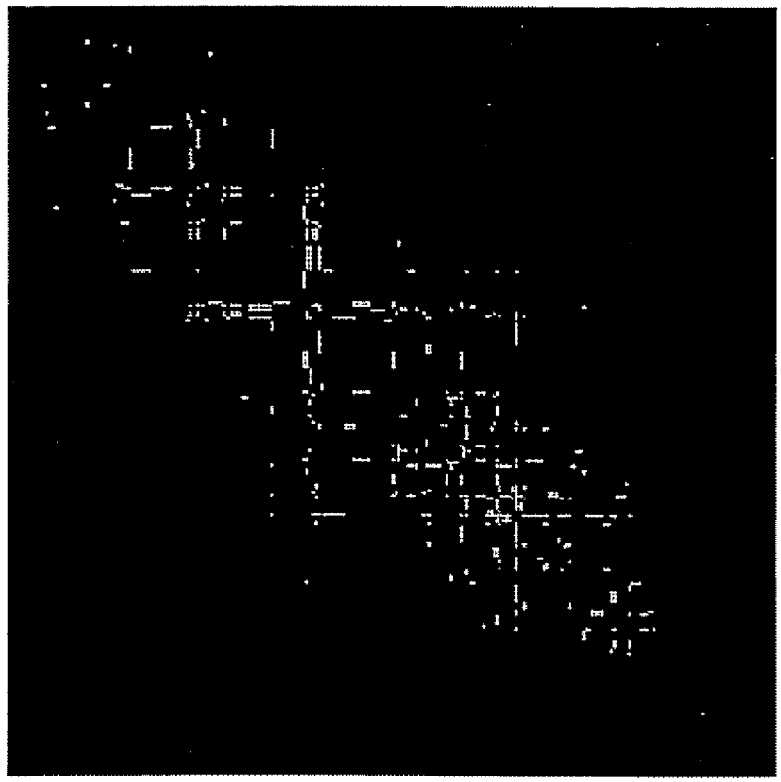
FIGS. 11A and 11B illustrate the extraction of a continuous band from the matrix of FIG. 10B and the residual associations that remain, respectively.
Figure 11A:
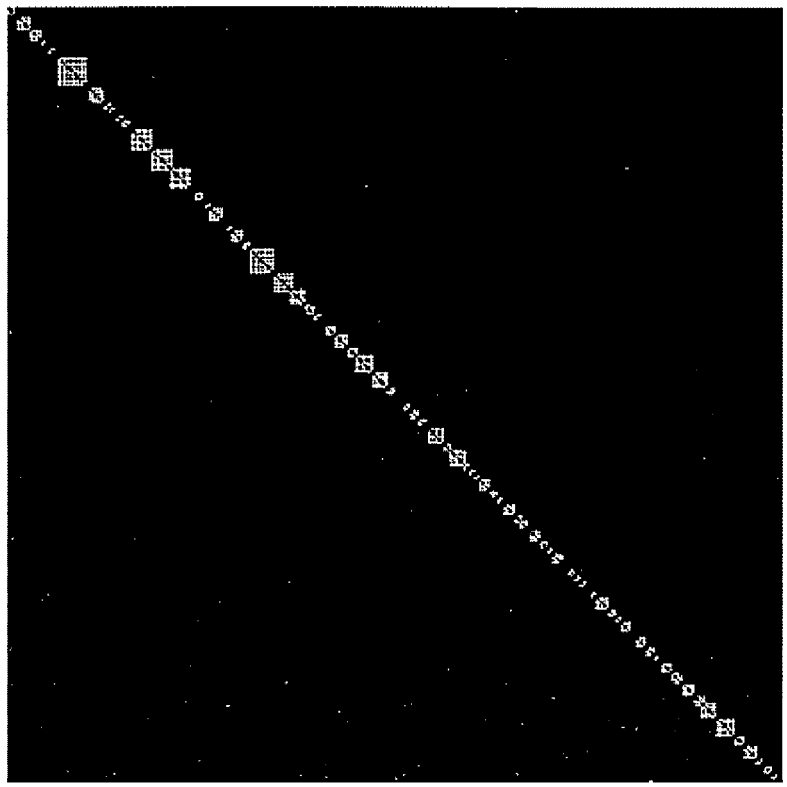

FIGS. 11A and 11B demonstrate the extraction of a continuous band from the matrix of FIG. 10B (Block 920 of FIG. 9), and the residual associations that remain, respectively. The continuous band of associations can be represented invariantly without switches by its prior/next projections and these projections can be effectively used to read associations according to some embodiments of the invention.

Sorting and extraction as described above can be performed by hardware or software as an export service, prior to loading the linear array of cells, in some embodiments of the invention. The extraction may not provide a perfect representation of the original matrix. In particular, few matrices are maximal and even the most ideal sorting will not remove all switches from projection-based representation. Thus, extraction may export a loss in linear structure, but one that can best capture a large non-linear set of associations within a linear structure.

Figure 12:
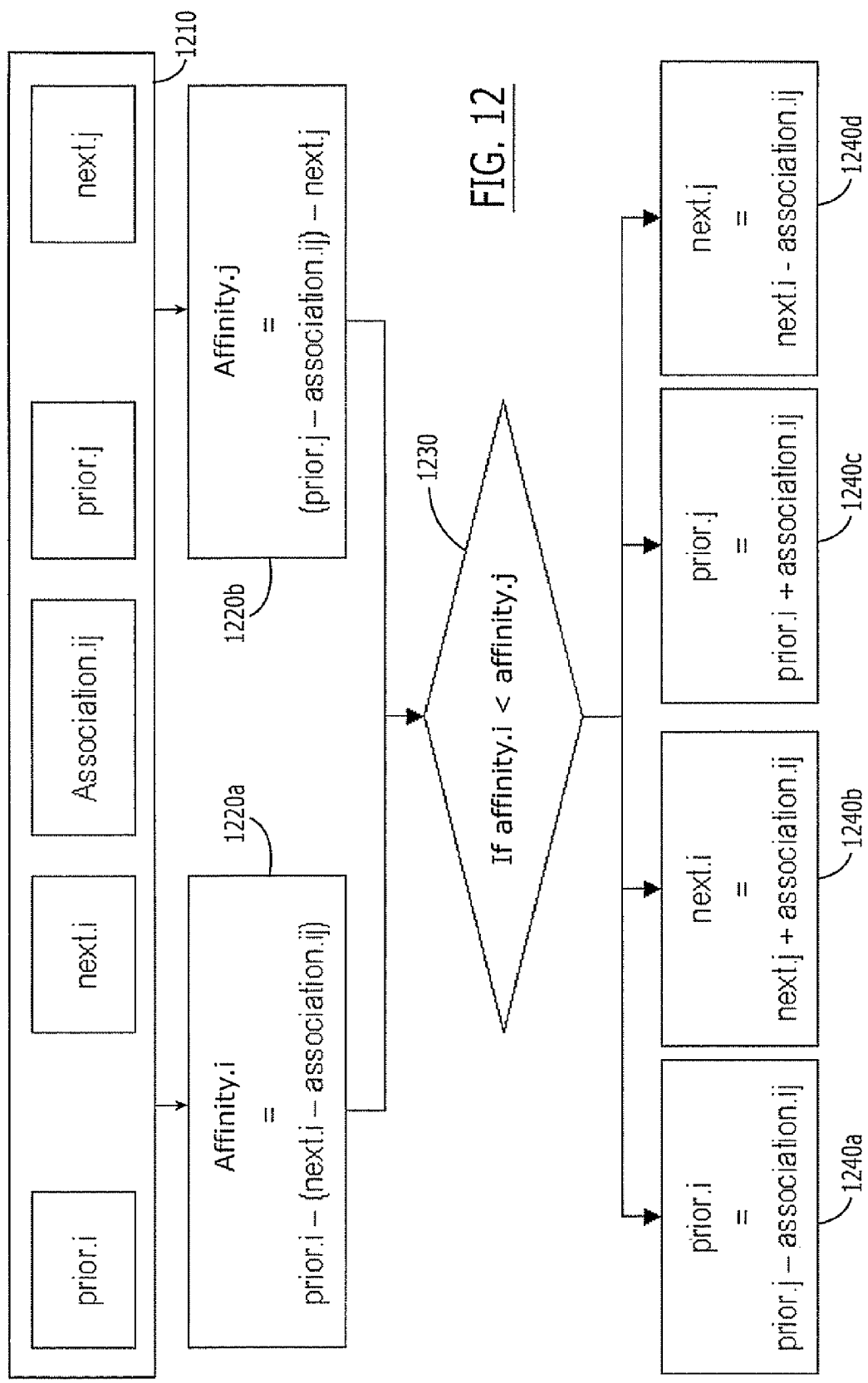
FIG. 12 is a flowchart of operations that may be performed to sort an associative matrix based on affinity by repeatedly swapping, according to various embodiments of the present invention.

FIG. 12 illustrates operations that may be performed to sort a matrix based on affinity by repeatedly swapping, which may correspond to Block 910 of FIG. 9. As shown in FIG. 12, at Block 1210, two neighboring terms i and j in a given matrix are represented. The prior and next associations for each term can be computed and stored. For example, the total number of projections along the row and column directions of the matrix may be summed to obtain the prior and next values. The association between i and j is also available from the matrix.

Still referring to FIG. 12, at Blocks 1220a and 1220b, each term's affinity is computed. For example, if prior.i=5 and next.i=15, then the term i has a strong affinity to move to the right (move next). To compare whether the term.i and term j order should be swapped, the two directions are compared. However, as shown in Block 1220a and 1220b, the association.ij should be removed from consideration. The two affinities are compared at Block 1230. If the terms should be swapped to move each term closer to more of its other associations then, as shown at Blocks 1240a-1240d, the prior and next projections remain the same except in accounting for association.ij, now that this possible next.i becomes a prior.i association (and a prior.j becomes a next.j association if it exists in the swap).

Figure 13:
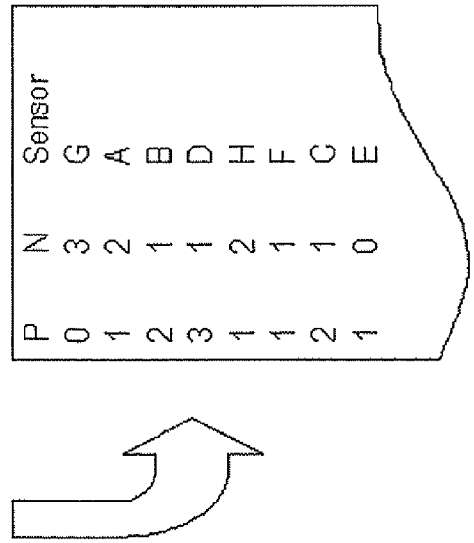
FIG. 13 illustrates an example of swapping in a "cliquey" matrix.
Figure 13:
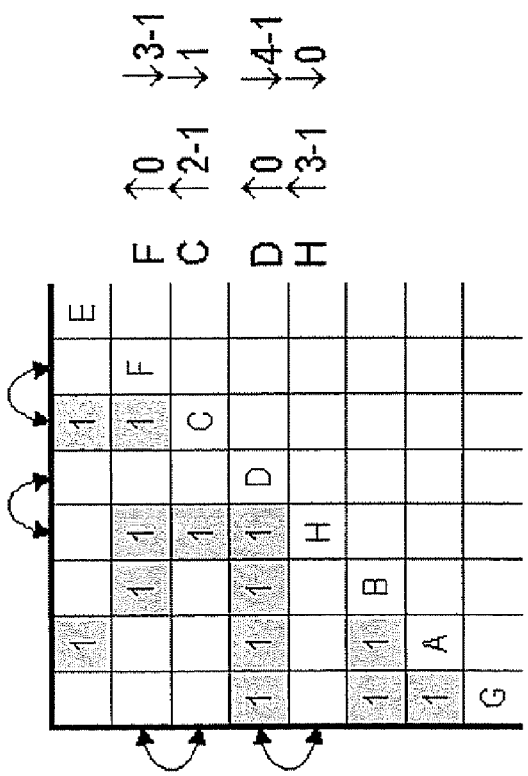

FIG. 13 illustrates an example of a swap of Blocks 1230-1240 of FIG. 12, and extractions of cliques. The matrix before the swap is shown on the left and the matrix after the swap is shown on the right. As shown in the left matrix, given the prior and next projections, F and C should be swapped with each other and D and H should be swapped with each other. For example, C has greater affinity to move across F, while F has greater affinity to move across C. Once swapped, contiguous bits are found along the diagonal. These bits are invariantly represented by their prior and next projections in the newly sorted order, as shown at the lower right of FIG. 13. This representation is then provided as a linear list of prior and next projections for each term in the resulting order, to provide, for example, an affinity-based sequence 120 of FIG. 1 along with the prior and next values 114, 116 for the cells 110 of FIG. 1.

Figure 14:
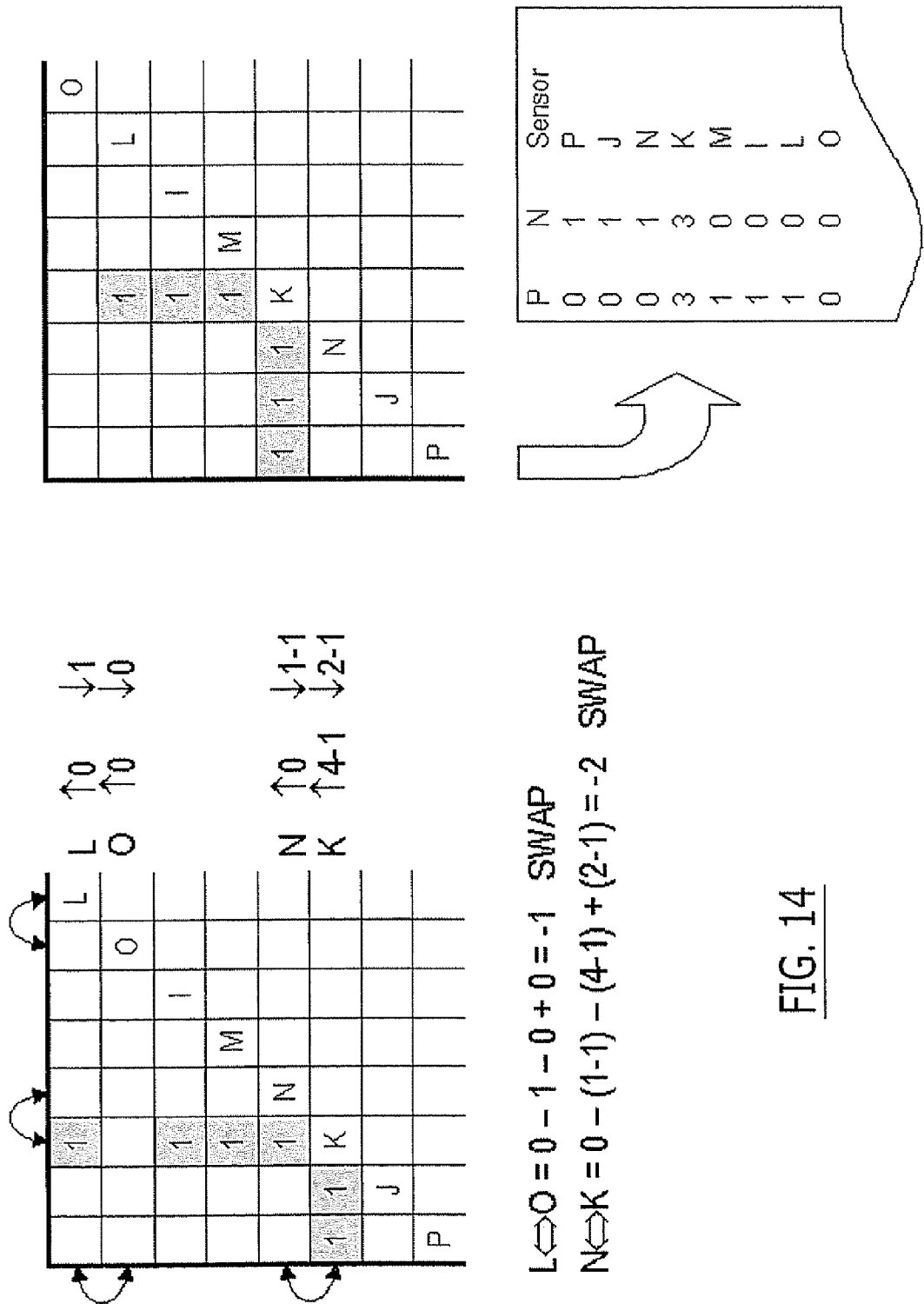
FIG. 14 illustrates an example of swapping in a "stringy" matrix.

FIG. 14 illustrates another example of the swapping rule of Blocks 1230-1240 of FIG. 12 when the associative matrix has more "stringy" data. The starting matrix is shown in the upper left quadrant, and the matrix after a swap is shown in the upper right quadrant. The prior/next associations and the sensor order is shown in the lower right quadrant. Accordingly, embodiments of FIG. 12 can provide affinity sorts for matrices that have cliquey associations and/or stringy associations.

FIGS. 12-14 are not the only techniques of sorting, according to embodiments of the invention. For example, other measures of affinity may include the specific distances of the associations bit and the distances-squared. In fact, there are a number of conventional matrix bandwidth minimization methods such as Cuthill-McKee and King's Algorithm. Other approaches may also include measurement of the Hamming distances and the number of matching associations between 2 terms to all the other terms, which treats the sort order problem as a Traveling Salesman problem. Theories of neural reorganization may also apply, including the idea that co-activated inputs tend to move closer to each other over time or that synapses are constantly remodeled until they hit the right dendrite. Any sorting technique may be used to obtain prior/next extraction/representation of its results.

Referring back to FIG. 9, contiguous bit extraction of Block 920 forms "cliquey" chains in the band and leaves "stringy" structure in the residual. However, extraction of Block 920 can handle either type of structure.

Figure 15B:
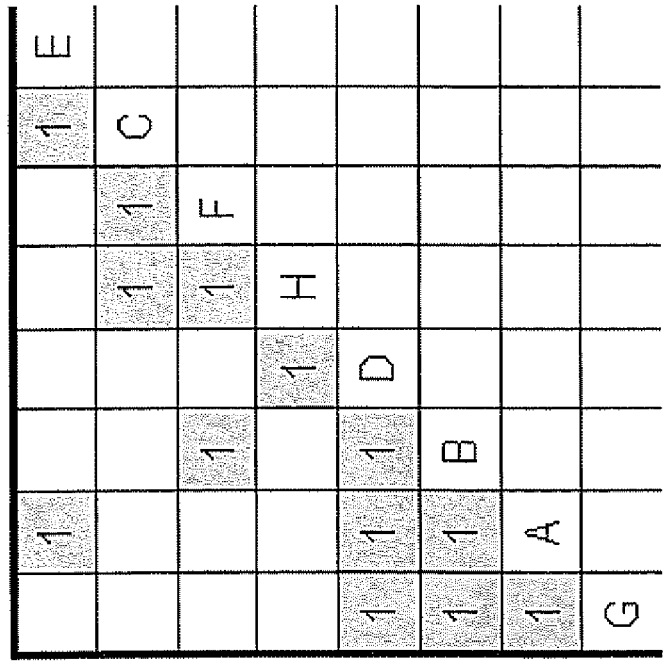
FIG. 15B illustrates the matrix of FIG. 15A after sorting.
Figure 15A:
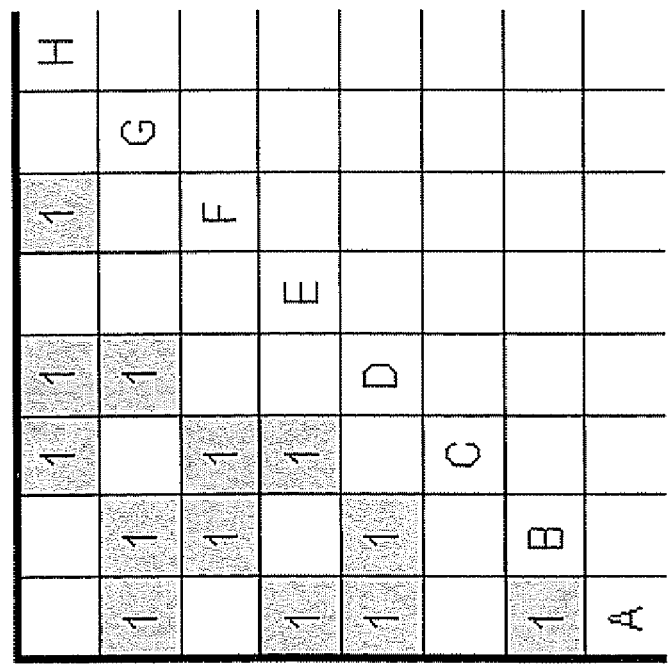
FIG. 15A illustrates an example of an associative matrix with eight inputs.

Band extraction techniques using projections, which may correspond to Block 920 of FIG. 9, will now be described. In particular, FIG. 15A illustrates an example starting associative matrix with eight inputs. FIG. 15B illustrates the matrix of FIG. 15B after sorting. FIGS. 15C, 15D, 15E and 15F illustrate results of extraction methods that use the entire sorted projection, use a fixed length projection, use a contiguous diagonal and use an optimal diagonal, according to various embodiments of the present invention.

Figures 15C, 15D, 15E, 15F:
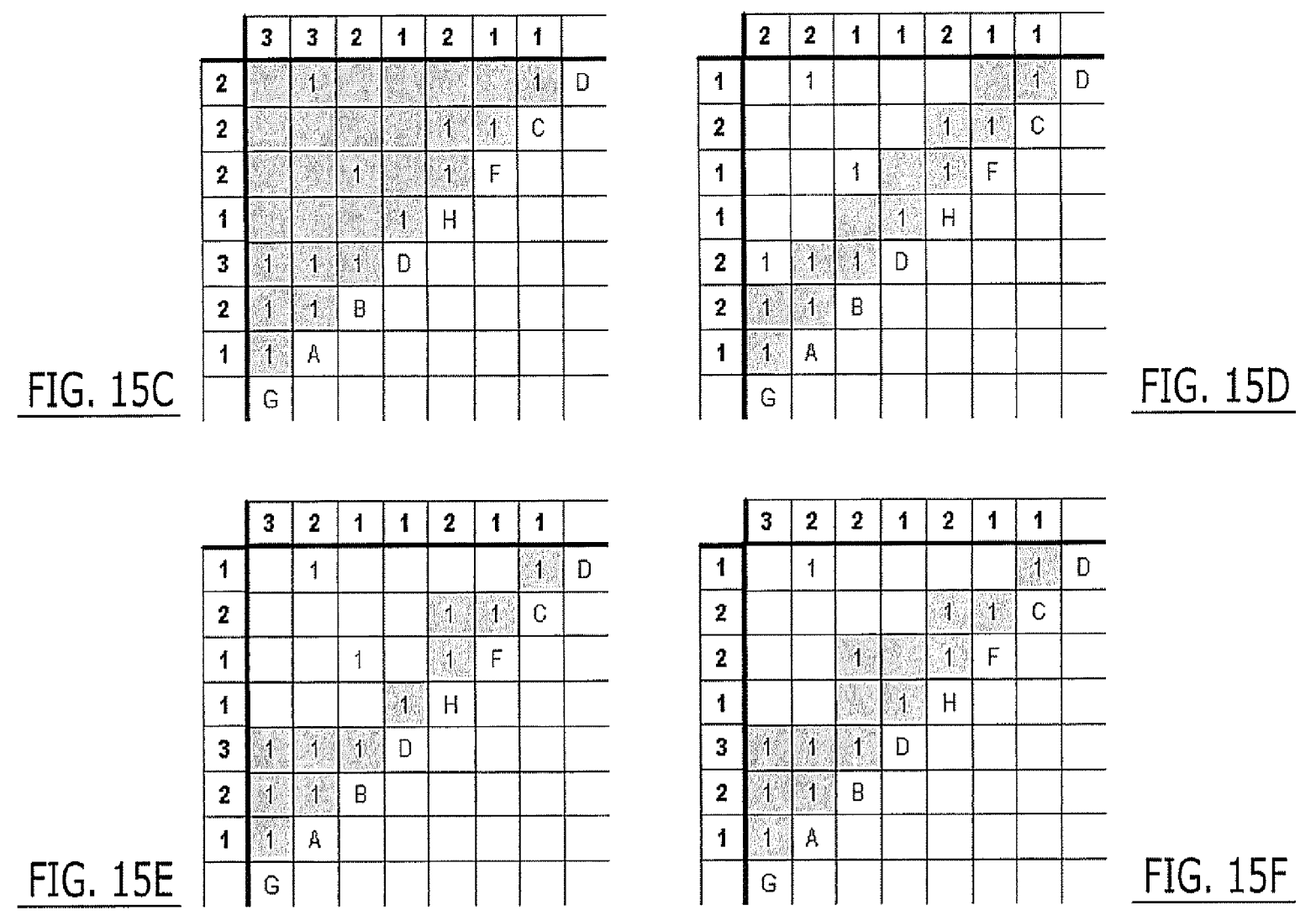

In particular, referring to FIG. 15C, the entire sorted projections may be used without any extraction. This may provide lossy sorting, because switches are not accounted for. In contrast, FIG. 15D uses fixed length extraction, here a fixed length of two. In these embodiments, a matrix is sliced into layers and a projection within the layer. Switch losses may be local.

FIG. 15E illustrates the use of a contiguous diagonal, i.e., run length from the diagonal. Multiple extractions may be performed, which can provide lossless projections. Contiguous diagonal extraction of FIG. 15E will be used for didactic purposes in the examples that follow. Finally, FIG. 15F illustrates extraction along an optimal diagonal, which provides a longest best projection. This extraction may reduce or minimize switch errors and may optimize the loss run.

It will also be understood by those having skill in the art that any other affinity sorting and/or band extraction technique currently known or developed later, may be used to obtain the prior/next association representations and the associated series of sensor inputs that are loaded into a plurality of associative memory cells according to embodiments of the present invention. Accordingly, embodiments of the invention should not be restricted to the techniques that were described above.

Figure 16:
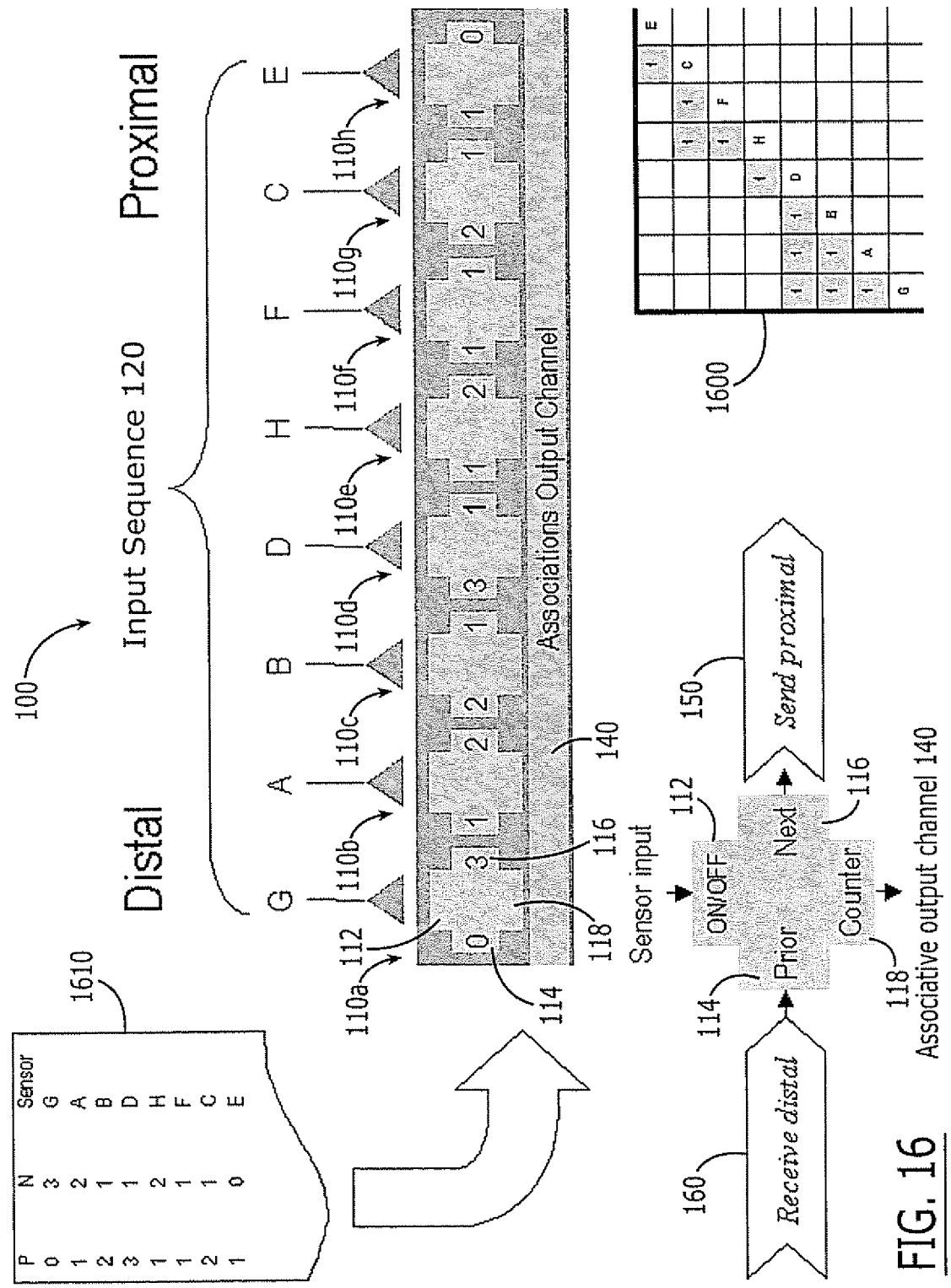
FIG. 16 is a block diagram illustrating how prior/next representations can be read to determine associations among a selected subset of sensor inputs, according to other embodiments of the present invention.

FIG. 16 is a block diagram of how the prior/next representations can be read to determine associations among a selected subset of the sensor inputs, according to other embodiments of the present invention. In FIG. 16, like numbers to FIG. 1 will be used, although different terminology may be used during explanation. In FIG. 16, eight cells (that may also be referred to as "processors") are shown that store the associative matrix of FIG. 15B after sorting and band extraction using a contiguous diagonal technique, as was shown in FIG. 15E. The sorted and extracted associative matrix 1600 of FIG. 15E is shown at the lower right of FIG. 16. The prior/next counts and the sensor order is shown at 1610, at the upper left of FIG. 16. An associative memory 1001 including eight cells 110a-110h is shown. It will be understood that eight cells are illustrated for didactic purposes, but real-world embodiments may have many more than eight cells. For simplicity, in FIG. 16, receiving of the next measure of the next association representation from adjacent distal cell 160 and sending the measure of prior association representation to an adjacent proximal cell 150 (from left to right) are illustrated. Receiving and sending in the opposite direction (from right to left) is not shown, because, as was already described, some embodiments of the present invention may only send representations in the distal direction or the proximal direction.

As also shown in FIG. 16, given the prior/next projections in the appropriate sort order using the example 1610 shown in the upper left, an array of cells 110a-110h can represent the order according to how each cell is addressed for each input, as shown by the input sequence 120. Each cell 110 stores the prior and next association representations 114, 116 for the specific input. The hardware, such as an FPGA, is assumed to have conversion and load methods that take the output representation 1610 of the sorting and extraction in order to implement this addressing and prior/next weighting. As will also be described below, each cell also holds the state of each input 112, as well as a counter 118 of local associations to be computed and read, depending upon the inputs. Finally, the processing logic 130 computes these associations through local message passing 150, 160 from and to neighboring cells. Such activation flows in the proximal direction and/or in the distal direction.

Figure 17:
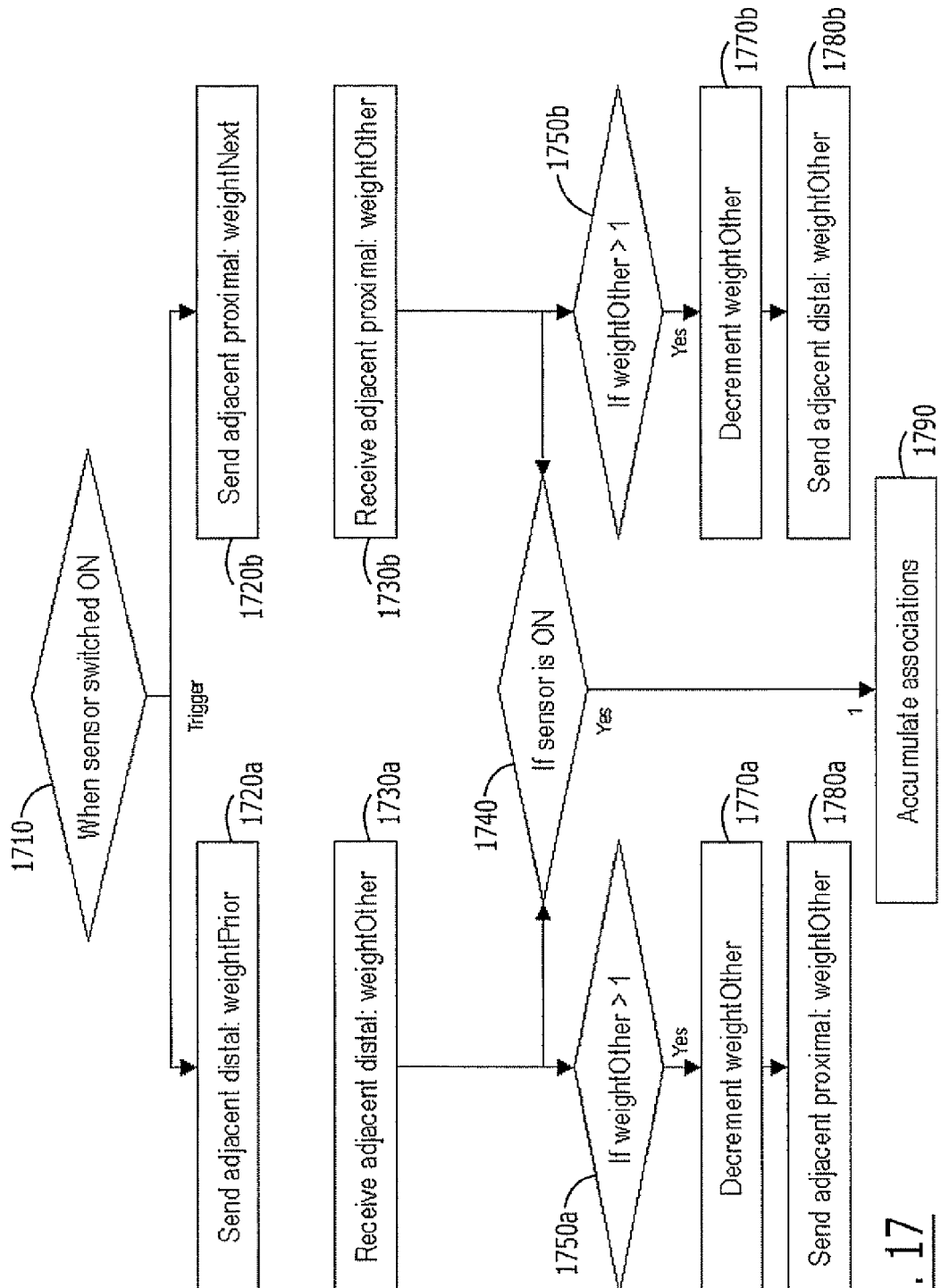
FIG. 17 is a flowchart of operations that may be performed to read an associative memory according to some embodiments of the present invention.

FIG. 17 is a flowchart of operations that may be performed by the processing logic 130 of a given cell 110 of FIG. 1 or 16, according to various embodiments of the present invention. FIG. 17 may be regarded as providing a compact representation of the operations that were already described in connection with FIGS. 2-5.

In particular, referring to FIG. 17, at Block 1710, when a sensor is turned on, this state is held in the cell as an input 112, but also causes the cell to send its own prior and next weight as signals to respective neighboring processors, as shown at Blocks 1720a and 1720b. These operations may correspond to operations of FIG. 2. In other words, each cell that is turned on tells the other cells how many associations it has: so many in the distal direction and so many in the proximal direction.

The remainder of FIG. 17 illustrates operations that may be performed when a neighboring cell receives a signal, which may correspond to operations of FIGS. 3-5. Referring again to FIG. 17, if a neighboring cell receives such a signal at Block 1730a or 1730b, it must, by definition of the cliquey representation, be associated with the source of the signal. In other words, the receiving cell must have one of the signaled associations with the source of the signal. Assuming that the weight is more than one at Blocks 1750a, 1750b, the receiving cell decrements the signal at Blocks 1770a, 1770b, to account for its own single association. It also passes the signal on to the next cell at Block 1780a, 1780b. Thus, activation from the source will fall as a function of distance from the source. It will be understood that at Blocks 1750a, 1750b, decrementing and sending are only performed if the weight that is received is more than one (i.e., two or more). In particular, if the weight that is received is one, it is not decremented to zero and passed because there may be no need to pass a zero weight.

Moreover, by definition of the cliquey representation, every source signal and receiving cell represents an association in memory. If the receiving cell is also on at Block 1740, this means that the association also exists in the given sensor pattern. Thus, if a cell receives an active signal (i.e., greater than zero) at Block 1730a, 1730b and its own sensor is on at Block 1740, then it accounts for this association in its association counter of Block 1790. In general, since many signals from many active sensors pass across many cells, the number of associations of each active input to the other active inputs is accumulated for each cell.

Figure 18:
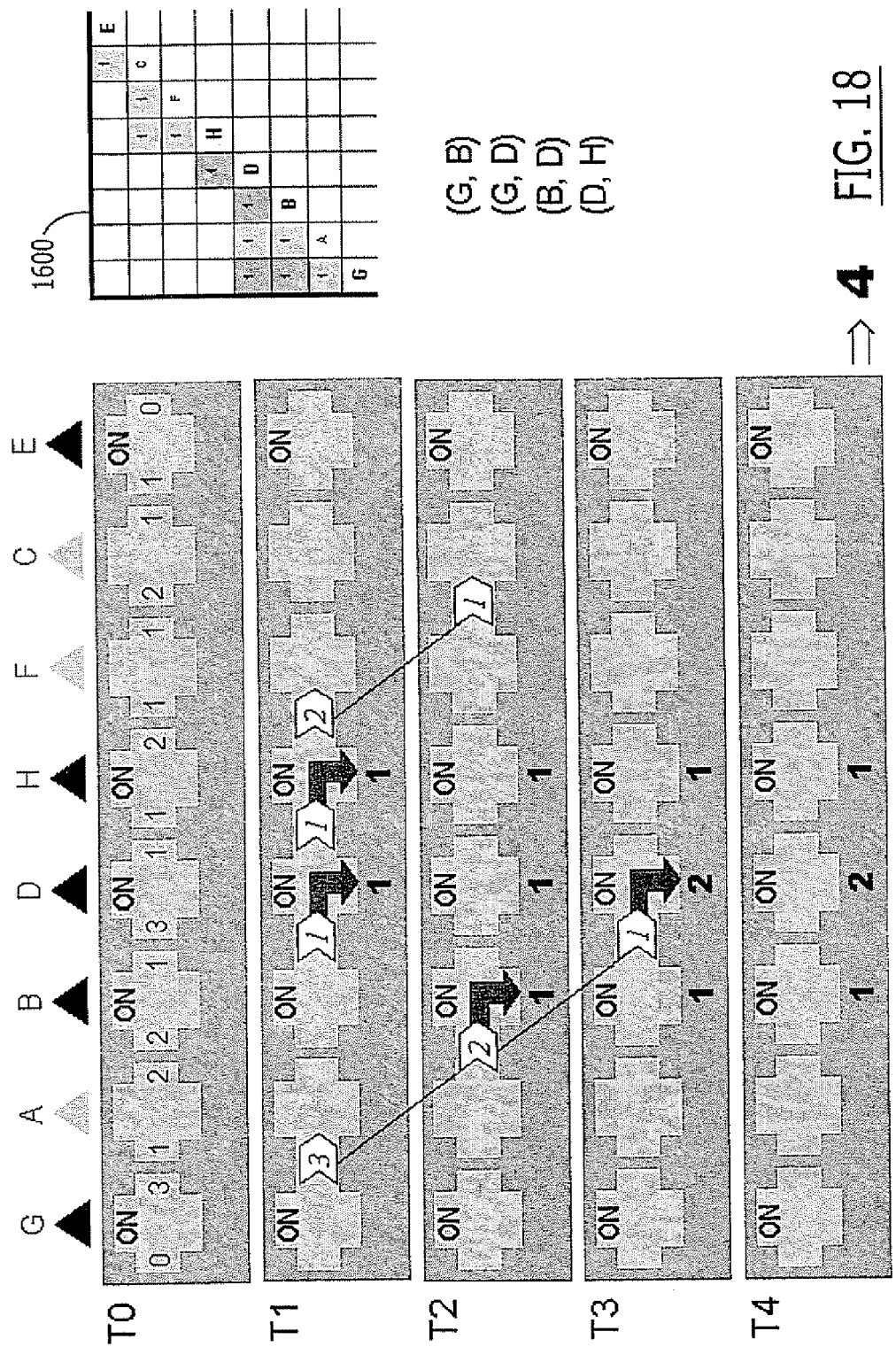
FIG. 18 provides an example of operations of FIG. 17.
Figure 19:
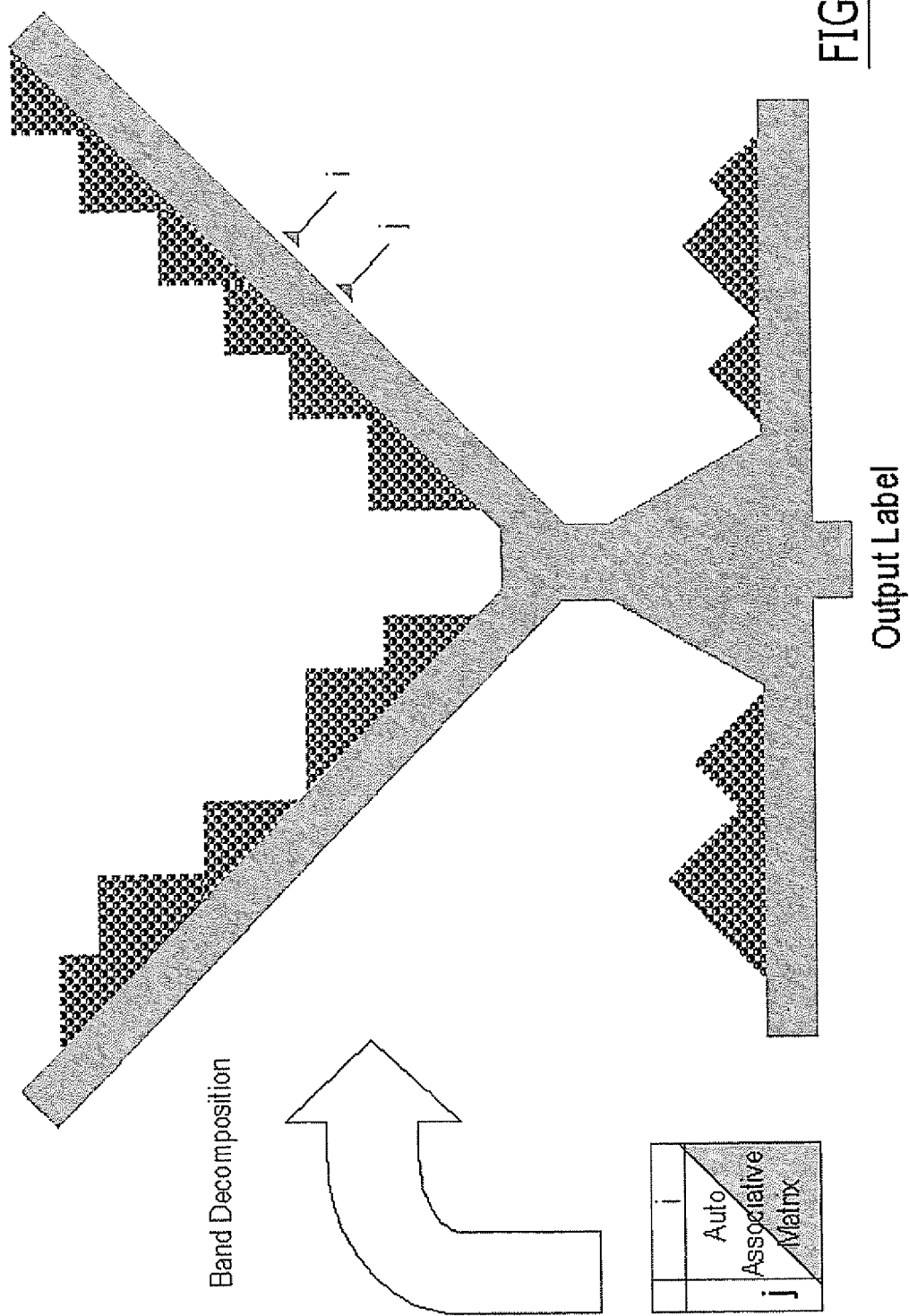
FIG. 19 conceptually illustrates matrix bands on a dendritic tree, according to some embodiments of the present invention.

FIG. 18 provides an example of the activation flow using the same example matrix 1600 as FIG. 16, which is reproduced at the right side of FIG. 18. In this example, the sensory pattern activates cells for {G, B, D, H, E}. For simplicity of presentation, only the signals in the proximal direction are shown. Although propagation in both directions is known to exist in real neurons and may be desirable for additional associative memory functions (such as pattern completion, non-active sensors and/or explanation by reading the number of associations for a specific input), the total number of pairwise associations across the sensor pattern may be determined using only one-way propagation. This is akin to accumulating the total neuron "experience" with the sensor associations as output by a single total value on an axon.

Referring to FIG. 18, the initial time/state T0, shows the fixed prior/next projection weights along with the state setting of ON sensors. Time/State T1 shows the proximal signaling of the next weights for each processor that is ON. The black arrows indicate the two cases in which a processor receives a distal signal AND it is ON itself. In the case of D and H, this represents the detection of an association, which is accumulated as its output. T2 shows how all the signals are decremented and passed along to the next processor. In this second time frame, the processor for B is the only case where the distal signal is greater than zero and the processor is also ON itself. This detects 1 association. T3 shows further decrement and propagation of non-zero signals. In this case, D accounts for another association (with G as the original source). By T4, there are no more effective signals and the accumulations show a total of 4 pair-wise associations in {G, B, D, H, E}, which is in fact the case for the total experience of this matrix with the sensor activations, as shown by the darker shading in the matrix 1600.

Note that while these cell arrays in the figure above represent different time steps of a singular physical array, this layout also points to the ability to pipeline the processing down the arrays while new inputs arrive.

Finally, this linear computing structure may be analogized to the dendritic structure of a complete neuron. Reflecting the associative memory described in FIG. 16, FIG. 19 expresses how the cliquey bands of a matrix can be distributed across the entire dendritic extension. Of course, this is a conceptual picture; the cliquey bands do not actually sit on the dendrites as such. However, the prior/next projections that represent such bands can be represented within the dendrite, and activations across arbitrary i and j sensor synapses can read associations of an associative matrix that is decomposed as such.

Many such neurons may co-exist, each representing a particular output label, akin to the fan-in of many inputs to a single neural output. But rather than the linear association modeling of how these inputs map to each output, this nonlinear modeling maps coincidences of inputs to each output—without the explicit crossbar of the original associative matrix.

Figure 20B:
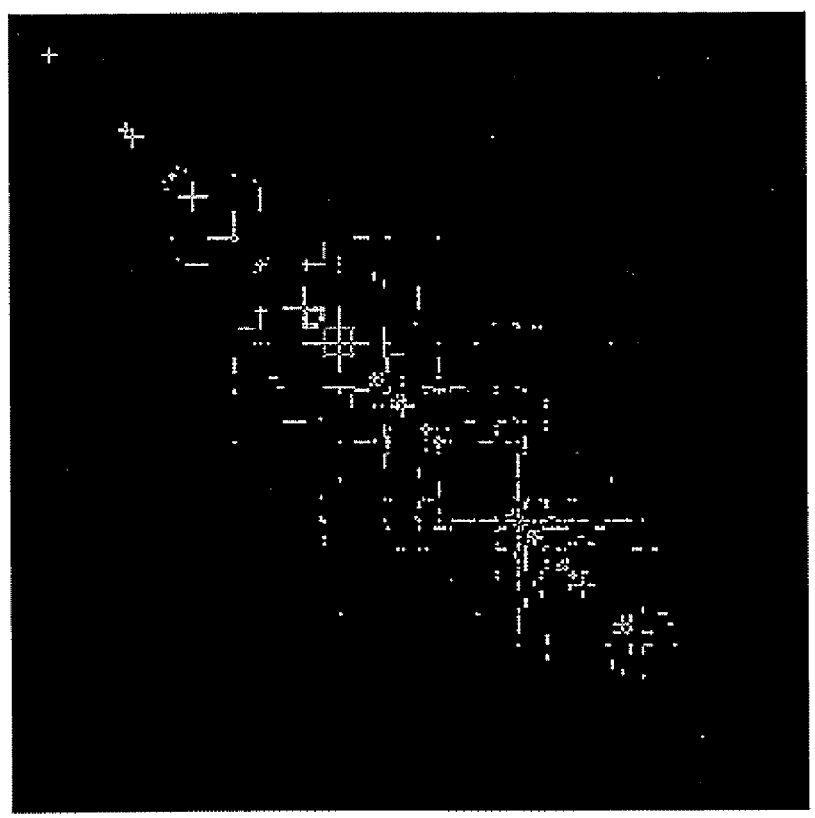
FIGS. 20A and 20B replicate FIG. 11B and illustrate results of a sort of a residual, respectively, according to some embodiments of the present invention.
Figure 20A:
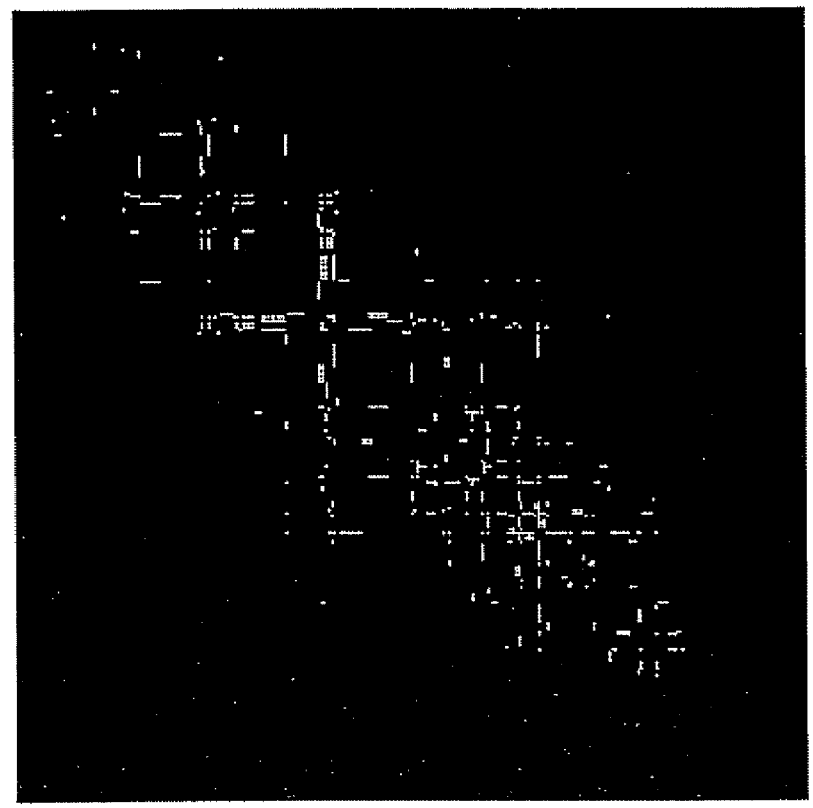

Embodiments of FIG. 16-18 may account for cliquey associations. However, other embodiments of the present invention may account for any arbitrary associations, whether cliquey or stringy. In particular, FIG. 20A replicates FIG. 11B, which shows the residue after continuous diagonal extraction of FIG. 11A. Thus, FIG. 20A shows the residual structure once a cliquey band is extracted from the original sorted matrix of FIG. 11A. FIG. 20B shows results of a sort of the residual, which does have a smaller overall bandwidth, but still displays a stringy structure rather than a cliquey structure. Thus, in general, a cliquey structure is removed, but stringy structure will remain. Embodiments of the present invention that now will be described in connection with FIGS. 21-22 can account for both cliquey and stringy structures.

Figure 21:
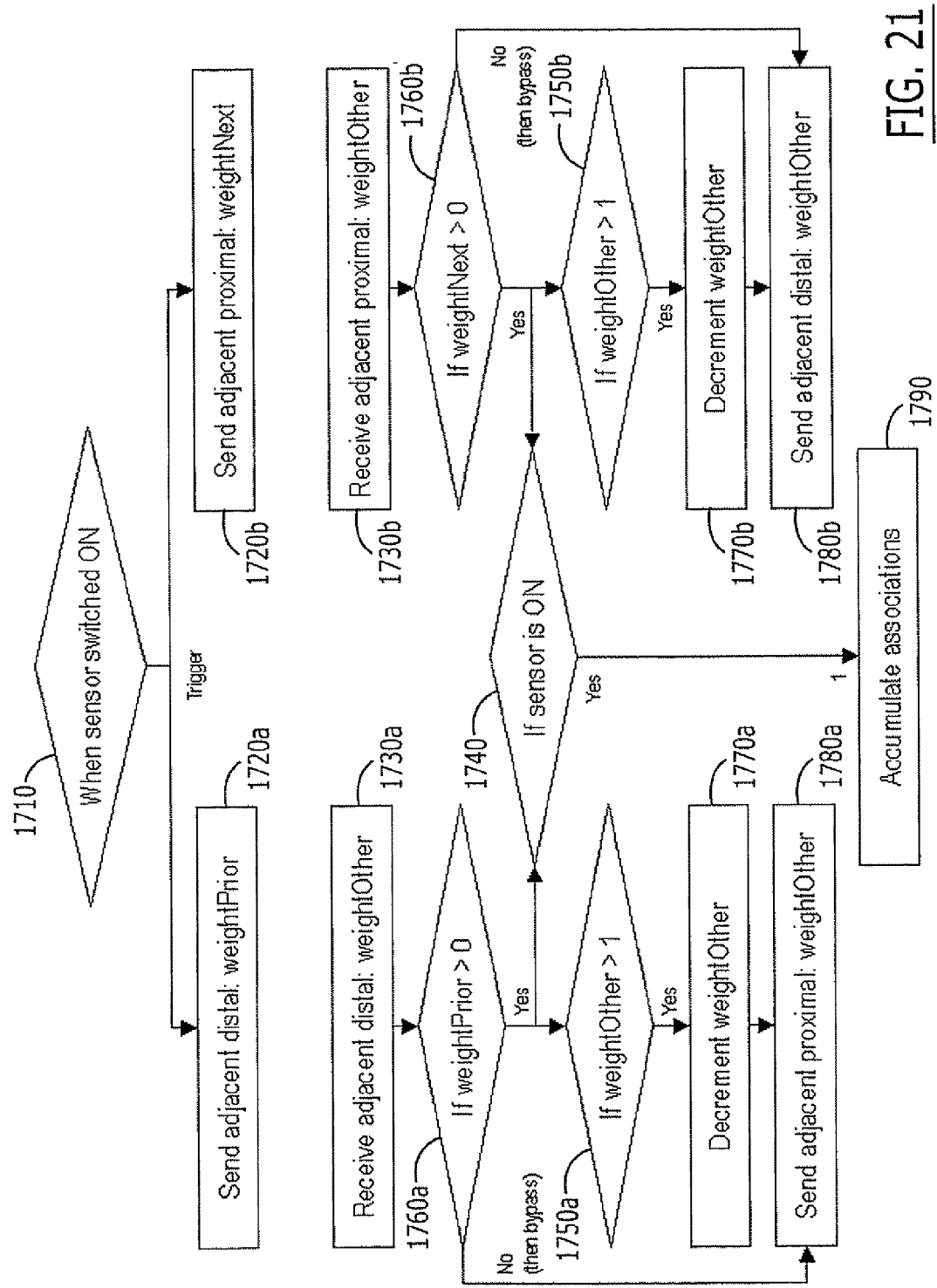
FIG. 21 is a flowchart of operations that may be performed to read an associative matrix according to other embodiments of the present invention, and may be used for cliquey and stringy matrices.

FIG. 21 illustrates generalized read logic that may be used with cliquey and stringy structures, and which may correspond to the operations of FIGS. 2-5 described above. Operations of FIG. 21 can operate for any prior/next projections. Most of the operations correspond to those that were described in connection with FIG. 17, and will not be described again. However, embodiments of FIG. 21 add Blocks 1760a and 1760b. Given the logic presented in FIG. 17, a test of the prior and next counts provides a switch that handles both cliquey and stringy arrangements. In particular, if a cell's prior weight equals zero, then, by definition, it does not participate in any signals coming from the distal direction. On the other hand, if the prior weight is greater than zero, then, by definition, it must be part of a local clique and account for its association with distal signals. In action, a cell with such a zero weight has nothing to do with the signal and simply passes it to the next cell. Only if its prior or next weight is non-zero does it account for this weight by checking for sensor association and decrementing the signal before passing it on. Accordingly, the addition of Blocks 1760a, 1760b may be regarded as providing the processing of FIG. 5.

Figure 22:
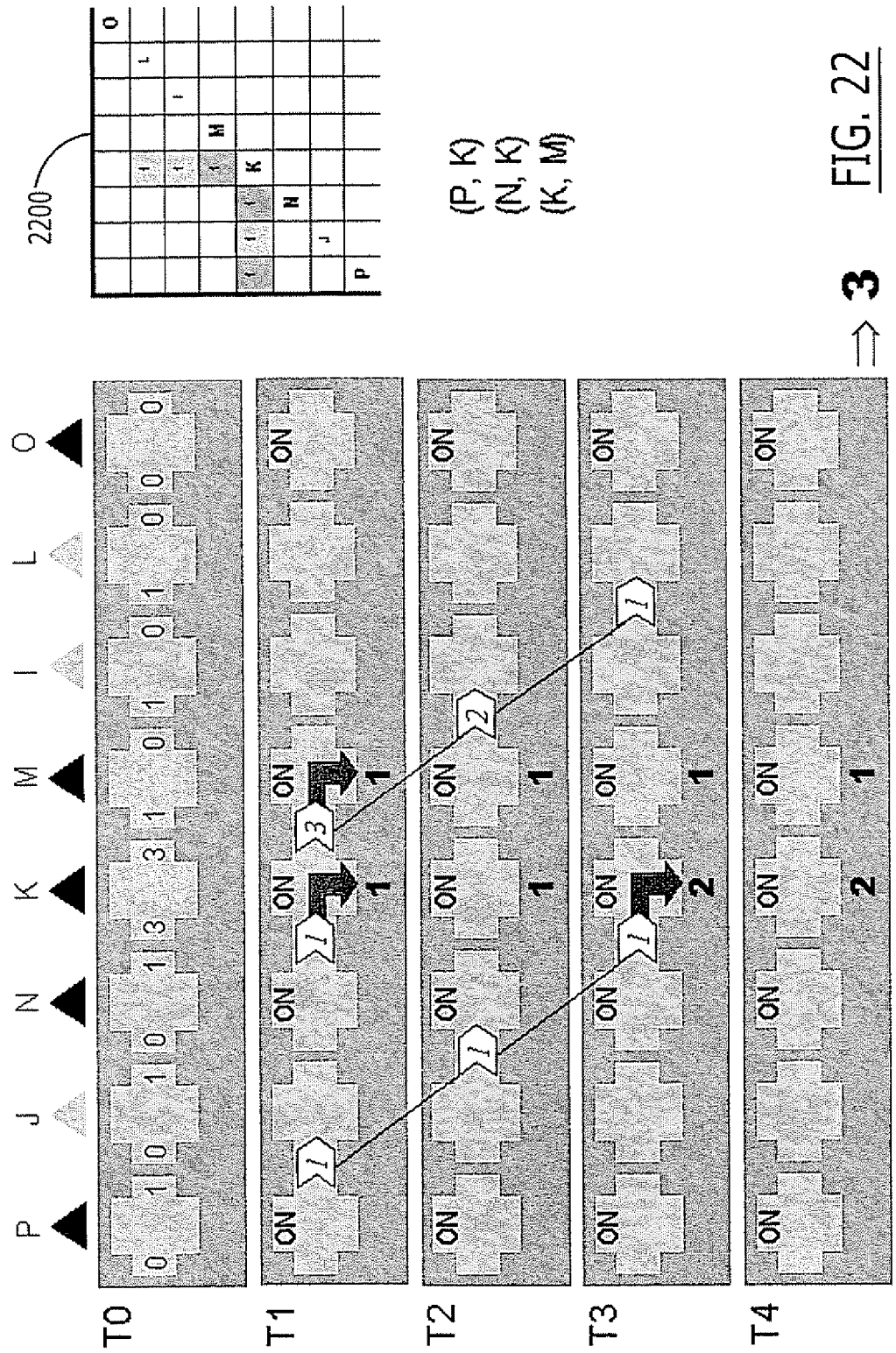
FIG. 22 provides an example of operations of FIG. 21.

FIG. 22 provides an example of how the addition of Blocks 2110a and 2110b accounts for stringy association structures. The same sensor sort order and input vector of {G, B, D, H, E} is used as before. However, the prior and next weights represent the stringy associations shown in the matrix 2200 on the right of FIG. 22. At T1, both G and B send their next weight of 1, but while D has a prior weight and is also ON and accounts the association, A has no prior weight and simply passes the full activation to the next processor without decrement. G's signal also passes B by the same logic at T2, but when G's signal reaches D, the logic returns to check its sensor activation and decrement the signal because it does have a prior weight. In this case, G does have an association with D and increments its active sensor association count. In total, three associations are found in {G, B, D, H, E}, as true within the explicit matrix representation 2200 as well, as shown by the darker shading in the matrix 2200.

Figure 23:
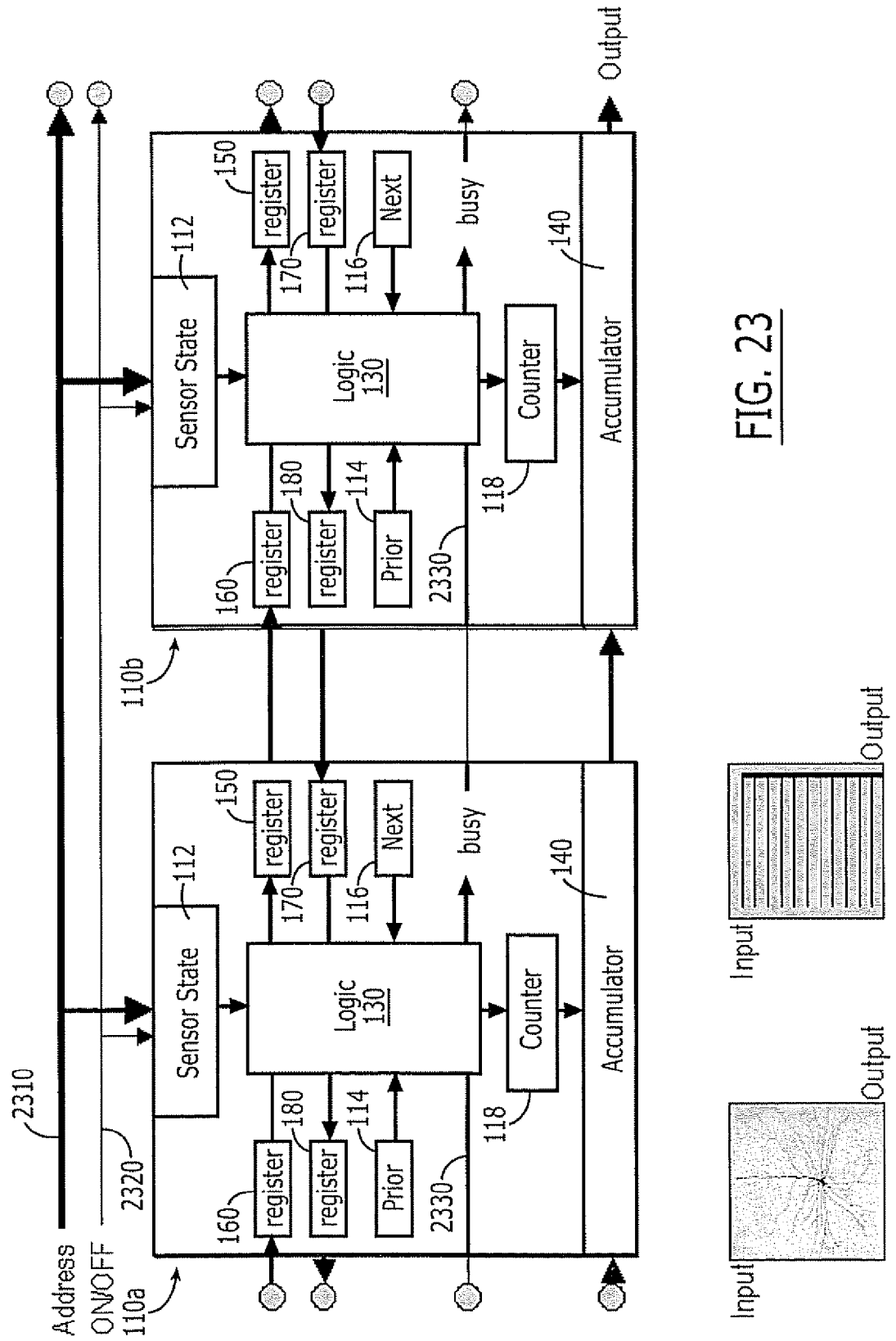
FIG. 23 is a hardware block diagram of two cells and their interconnection, according to some embodiments of the present invention.

FIG. 23 is a block diagram of two cells and their hardware interconnection, according to some embodiments of the present invention. Like numbers with FIGS. 1 and 16 are used. An address bus 2310 and an on/off bus 2320 may be used to allow each cell 110a, 110b to be addressed individually. For instance, a particular address to a cell 110 may be set on the address bus along with an ON signal on the on/off bus 2320, to turn a particular sensor state 112 to ON. Similarly, each sensor state can be turned OFF. This on/off control at the level of each cell may be provided for real time embedded systems in which particular aspects of the environment may change over time, but the general setting of other sensors may remain constant from one time to another. Moreover, although not explicitly described, turning sensors 112 off and triggering signals that decrement given association counters is also possible in other embodiments, such as by adding a positive/negative sign to the signals with similar added logic to decrement each cell's association count. Other buses and/or addressing techniques may be used to set the sensor state 112 and the prior and next values 114 and 116. These techniques are well known to those having skill in the art, and need not be described in further detail herein.

Other applications may drive arbitrarily new sensor states from one time to the next. For example, document classification may present a new document description vector from one case to another with little overlap to be expected. In such applications, a general RESET code may clear all sensor states at once, rather than turning the old vector OFF before clamping the new vector.

Moreover, the distal and proximal association representations that are sent or received, as was described by arrows 150, 160, 170 and 180 of FIG. 1, may be stored in registers, as shown in FIG. 23. The detailed design of registers is well known to those having skill in the art and need not be described further herein. Moreover, a detailed design of the processing logic 130 to implement operations of FIGS. 2-5, 17 and/or 21 may also be provided using techniques well known to those having skill in the art, which may depend upon the particular hardware technology/architecture that is being used.

As shown in FIG. 23, all signals may be local, i.e., between neighboring cells 110. FIG. 23 shows local signal buses in both the proximal and distal directions. As mentioned above, one direction may be sufficient for total association counting, but both directions may be desired for more specific reading of each cell's associations. Generally, a chain of accumulators 140 can add the results of local counters 118 to provide a total association output. Other accumulation techniques, including the passing of the specific associations that were found, may also be provided in an accumulator 140, according to other embodiments of the present invention.

The message passing design generally can be sub-linear in time and can be energy efficient. Processing may only be performed in response to changes in sensor state and the extent of processing is local, to the extent of the prior/next signaling strength. Because such a design also may not need a global clock, a busy line 2330 can serve to inform an external system that the output is stable and complete. Each cell raises the line only when processing a signal. When the line is low, all processing has been completed.

Finally, an entire chip of a large number of such linear arrangements of cells can be composed as shown. Akin to the way dendrites are imagined to simply sum their proximal activity into a larger summation for the entire neuron (as illustrated at the bottom left of FIG. 23), linear arrays of cells can be further accumulated together in a number of layouts, one of which is shown at the bottom right of FIG. 23.

Embodiments of the invention that have been described above in connection with FIGS. 17 and 21 have assumed that the prior association representations and the next association representations that are stored, and the measure of the next association representations and the measure of the prior association representations that are transferred among cells, comprise associative weights. However, in other embodiments of the present invention, rather than storing and sending weights, based on projections, actual segments of prior/next values of an associative matrix may be stored and passed. Thus, in some embodiments, the representations may be actual prior/next segments of an associative matrix.

Figure 24:
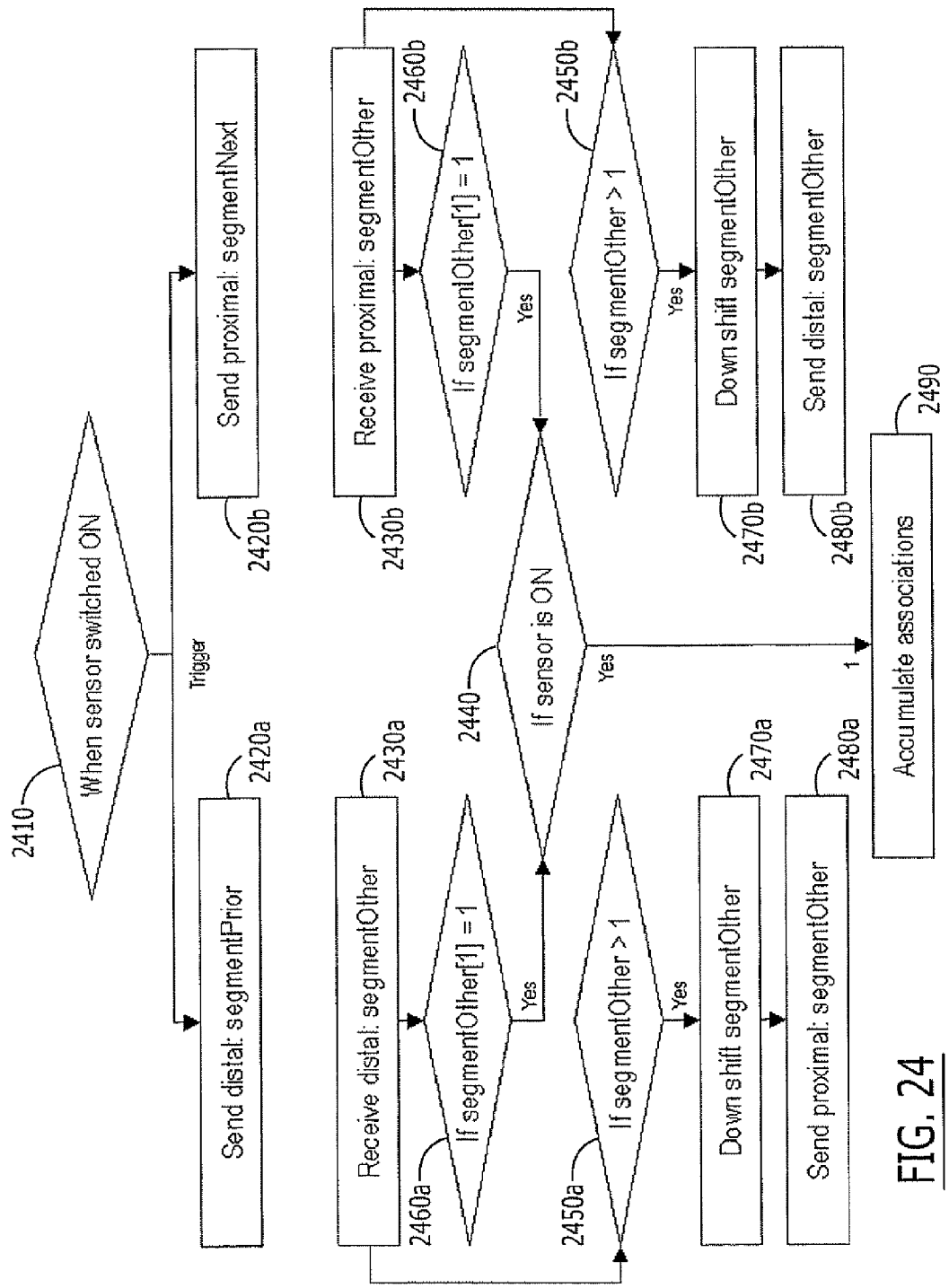
FIG. 24 is a flowchart of operations that may be performed to read an associative matrix using actual segments of associations rather than weights, according to some embodiments of the present invention.

Thus, in other embodiments of the invention, described in connection with FIGS. 24 and 25, the prior association representation comprises a prior association segment, the next association representation comprises a next segment, the measure of the prior association representation comprises a segment, and the measure of next association representation comprises a segment. The segment may need to have a fixed size, such as 64 bits, to accommodate hardware constraints, and may be generated using a sorting method of, for example, FIG. 5D, which uses a fixed length. Within the constraints of segment size, the entire prior/next segment, rather than a projection value, may be stored.

Remarkably, notwithstanding the fact that a prior/next matrix segment is stored rather than a weight, read logic processing may be performed that is quite similar to that which was already described in connection with FIGS. 17 and 21. In particular, comparing FIGS. 17 and 24, processing can be remarkably similar, except that what is sent may be a segment, rather than a weight, and a determination may be made as to a given least significant bit of a segment. Accordingly, blocks of FIG. 24 that are analogous to those of FIG. 17 have been labeled with an analogous 2400 sequence numbering. Thus, operations of Blocks 2410-2490 may correspond to operations of Blocks 1710-1790 and a detailed explanation will not be repeated.

Figure 25:
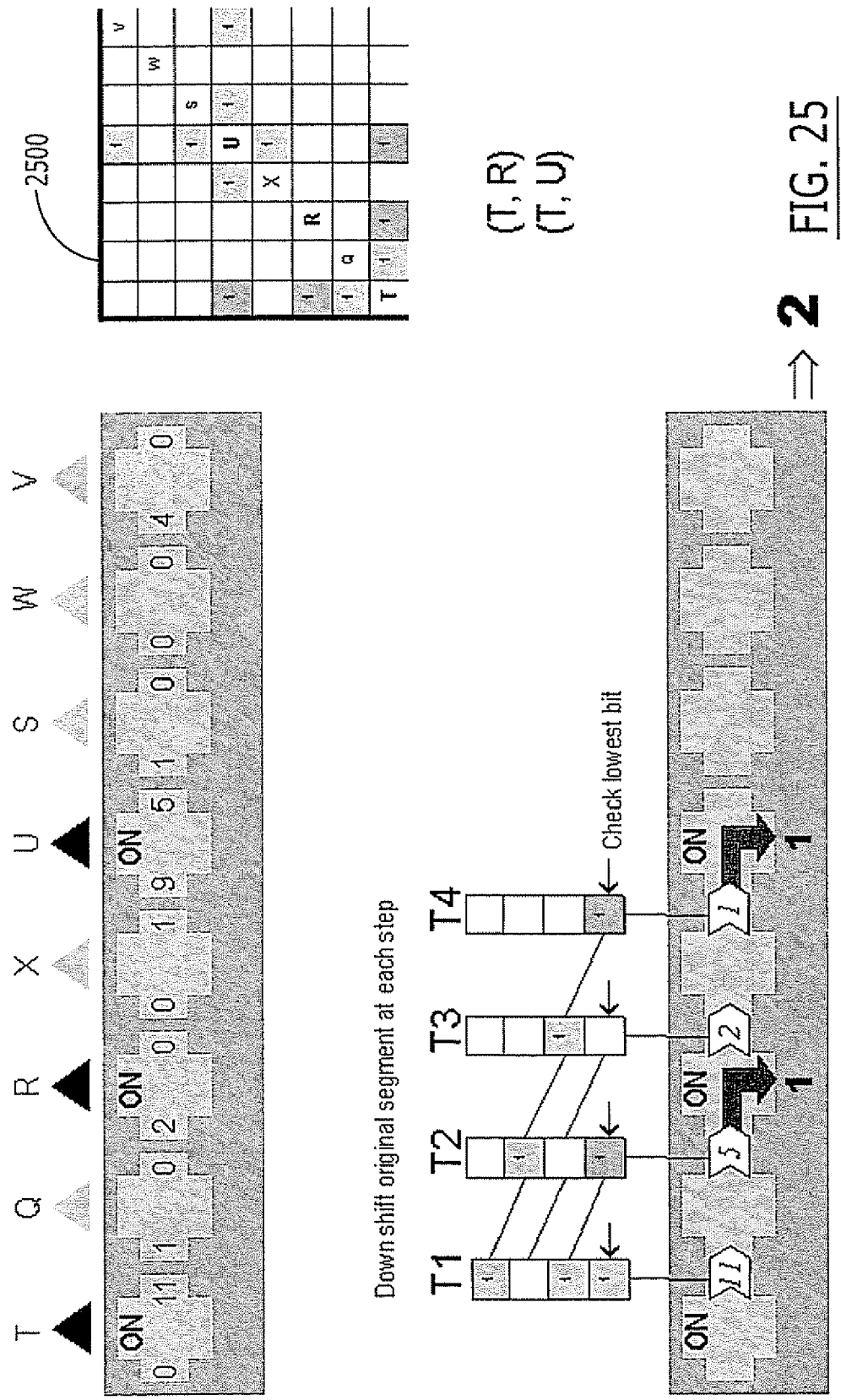
FIG. 25 illustrates an example of operations of FIG. 24.

FIG. 25 illustrates a read example for the matrix 2500 shown at the right side of FIG. 25. As shown at the top left of FIG. 25, instead of prior and next weights, actual prior and next segments are stored. The bottom left of FIG. 25 illustrates processing of the G sensor only at time periods/states T1-T4.

In yet other embodiments of the present invention, rather than storing and sending weights or segments, a vector, which represents a prior/next segment of an associative matrix, may be stored, and pointers to a position in the vector may be transferred.

Figure 26:
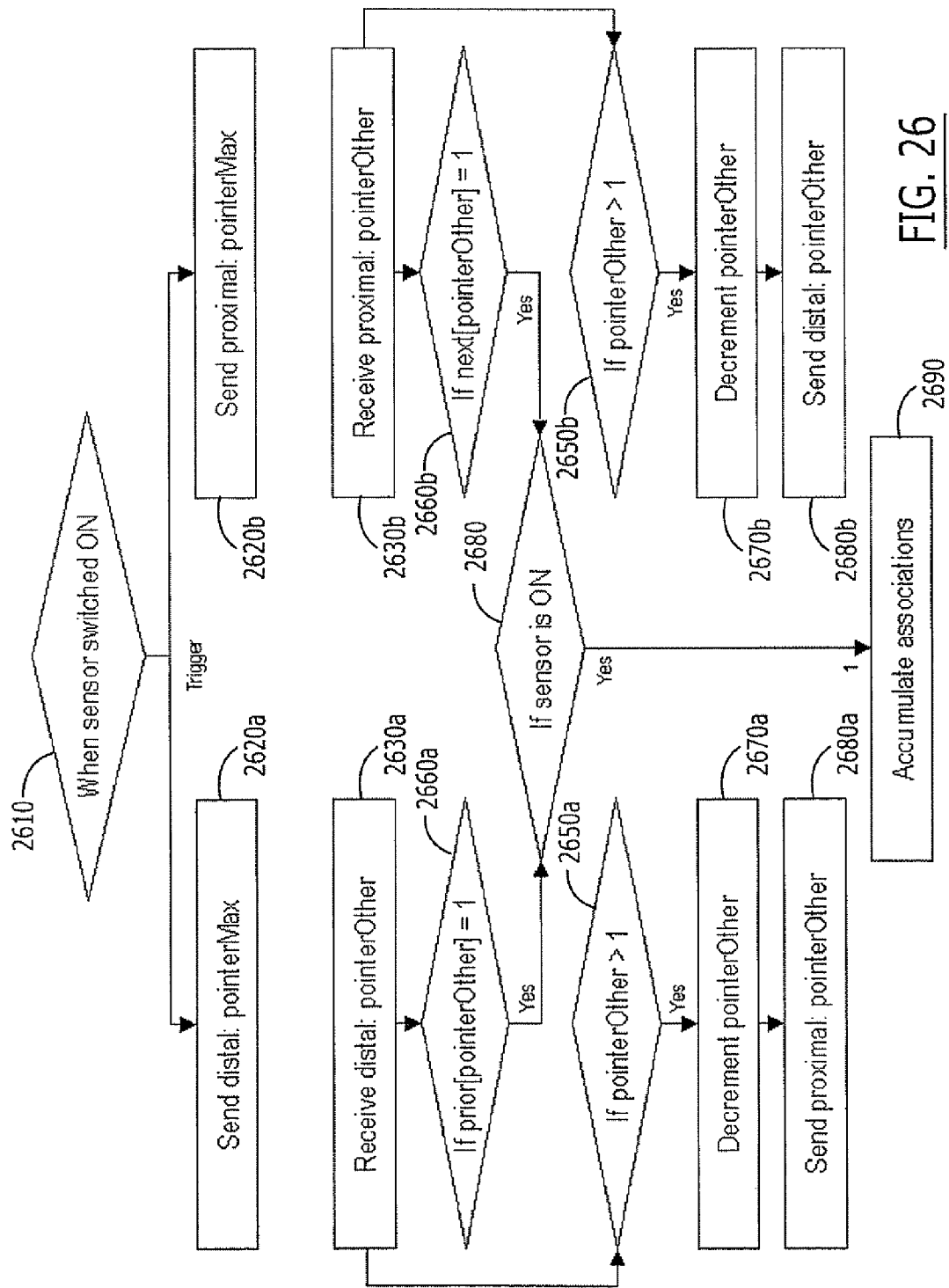
FIG. 26 is a flowchart of operations that may be performed to read an associative matrix using vectors and pointers rather than weights, according to some embodiments of the present invention.

Thus, in yet other embodiments of the invention, described in connection with FIGS. 26 and 27, the prior association representation comprises a prior association vector, the next association representation comprises a next association vector, the measure of the prior association representation comprises a pointer, and the measure of next association representation comprises a pointer. The vector may need to have a fixed size, such as 64 bits, to accommodate hardware constraints, and may be generated using a sorting method of, for example, FIG. 5D, which uses a fixed length. Within the constraints of vector size, a vector representing the entire prior/next segment, rather than a projection value, may be stored.

Remarkably, notwithstanding the fact that a vector is stored rather than a weight or matrix segment, read logic processing may be performed that is quite similar to that which was already described in connection with FIGS. 17, 21, 24 and 25. In particular, comparing FIGS. 17, 24 and 26, processing can be remarkably similar, except that what is sent may be a maximum vector, rather than a weight, and a determination may be made as to whether a given bit position is active (e.g., equal to one), using a pointer. Accordingly, blocks of FIG. 26 that are analogous to those of FIGS. 17 and 24 have been labeled with an analogous 2600 sequence numbering. Thus, operations of Blocks 2610-2690 may correspond to operations of Blocks 1710-1790 and 2410-2490 and a detailed explanation will not be repeated.

Figure 27:
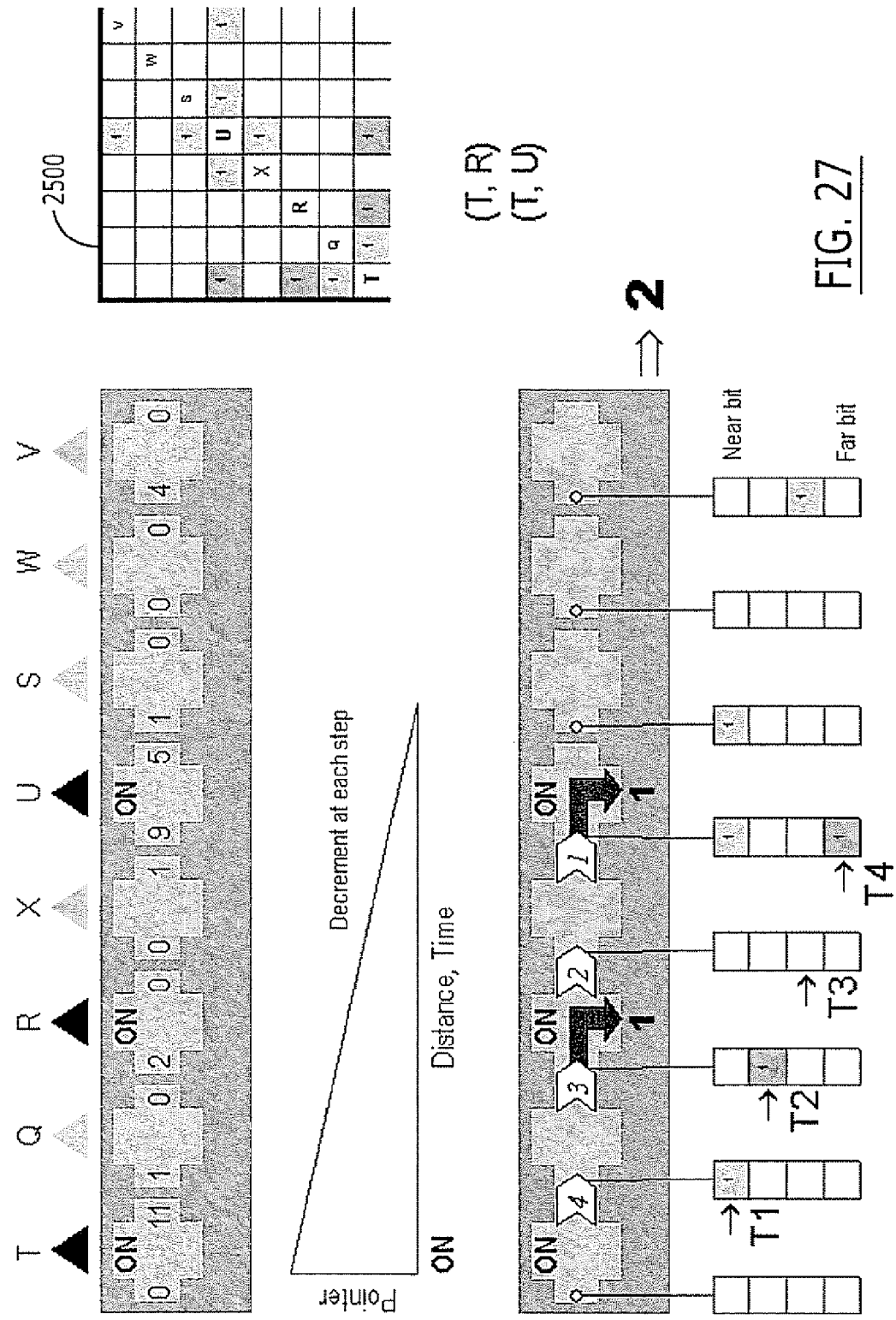
FIG. 27 illustrates an example of operations of FIG. 26.

FIG. 27 illustrates a read example for the matrix 2500 shown as the right side of FIG. 27. As shown at the top left of FIG. 27, instead of prior and next weights, a prior and next vector is stored that indicates the maximum value of the highest bit. The bottom left of FIG. 27 illustrates processing of the G sensor only at time periods/states T1-T4. The arrows at the bottom of the figure illustrate the pointers and decrementing of the pointers over time. Accordingly, embodiments of the present invention contemplate storing more than associative weights based on projections, and may store any representation of an association including the association segment itself.

It will also be understood by those having skill in the art that the various embodiments of the invention may be combined in various permutations and combinations. For example, embodiments of FIGS. 17, 21, 24 and/or 26 may be combined in various permutations and combinations and/or may be combined with other representations of prior/next associations.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. An associative memory comprising:
a plurality of associative memory cells, a respective cell including a sensor input, a prior association representation, a next association representation and an associative output, the plurality of cells being serially connected to form a linear array, such that the sensor inputs, the prior association representations and the next association representations of the serially connected cells are arranged in a sequence from distal to proximal cells based on affinities of associations among the sensor inputs;
a respective cell also including processing logic therein:
that is responsive to the sensor input of the respective cell being active to send a measure of the next association representation to an adjacent proximal cell and/or to send a measure of the prior association representation to an adjacent distal cell; and
that is further responsive to the sensor input being active, and to receipt of the measure of the next association representation from an adjacent distal cell, to accumulate an associative count in the associative output and/or that is responsive to the sensor input being active, and to receipt of the measure of the prior association representation from an adjacent proximal cell, to accumulate an associative count in the associative output,
wherein the affinities of associations among the sensor inputs are determined by repeatedly swapping inputs, prior association representations and next association representations in the series based upon affinities of associations in the proximal and distal directions.

2. An associative memory according to claim 1 wherein the processing logic is further responsive to receipt of the next association representation from an adjacent distal cell and to the prior association representation being active, to decrement the measure of the next association representation that was received and to send the measure of the next association representation that was decremented to the adjacent proximal cell and/or is further responsive to receipt of the measure of the prior association representation from an adjacent proximal cell and to the next association representation being active, to decrement the measure of the prior association representation that was received and to send the measure of the prior association representation that was decremented to the adjacent distal cell.

3. An associative memory according to claim 2 wherein the processing logic is further responsive to receipt of the measure of the next association representation from an adjacent distal cell and to the prior association representation being inactive, to send the measure of the association representation that was received to the adjacent proximal cell and/or is further responsive to receipt of the measure of the prior association representation from an adjacent proximal cell and to the next association representation being inactive, to send the measure of the prior association representation that was received to the adjacent distal cell.

4. An associative memory according to claim 1 wherein the affinities of associations among the sensor inputs are further determined by extracting bands from the series that has been repeatedly swapped, based on projections.

5. An associative memory according to claim 4 wherein the projections comprise maximal projections, fixed length projections and/or longest nonmaximal projections.

6. An associative memory according to claim 1 wherein the prior association representation and the measure of the prior association representation comprise prior association weights, and the next association representation and the measure of the next association representation comprise next association weights.

7. An associative memory according to claim 1 wherein the prior association representation comprises a prior association vector, the next association representation comprises a next association vector, the measure of the prior association representation comprises a pointer and the measure of next association representation comprises a pointer.

8. An associative memory according to claim 1 wherein the prior association representation and the measure of the prior association representation comprise segments of prior associations, and the next association representation and the measure of the next association representation comprise segments of next associations.

9. An associative memory according to claim 1 further comprising an accumulator that is connected to the associative outputs of the plurality of cells.

10. An associative memory according to claim 1 wherein the sensor input, the prior association representation, the next association representation, the associative output, the measure of the next association representation and the measure of the prior association representation are stored in corresponding registers in a respective cell.

11. An associative memory according to claim 1 wherein the processing logic is configured to operate upon a plurality of sensor inputs in a pipelined manner.

12. A computer-implemented method of determining associations using an associative memory that comprises a plurality of associative memory cells that are serially connected in a sequence from distal to proximal cells to form a linear array, the method comprising:
    loading into a respective memory cell a prior association representation and a next association representation for a respective sensor input of the memory cell, wherein the sensor inputs, the prior association representations and the next association representations of the serially connected cells are arranged in a sequence from distal to proximal cells based on affinities of associations among the sensor inputs;
    activating selected sensor inputs to determine associations therebetween;
    responsive to the sensor input being active, sending a measure of the next association representation to an adjacent proximal cell and/or sending a measure of the prior association representation to an adjacent distal cell;
    responsive to the sensor input being active, and to receipt of the measure of the next association representation from an adjacent distal cell, accumulating an associative count and/or responsive to the sensor input being active, and to receipt of the measure of the prior association representation from an adjacent proximal cell, accumulating an associative count; and
    repeatedly swapping inputs, prior association representations and next association representations in the series based upon affinities of associations in the proximal and distal directions to determine the affinities of associations among the sensor inputs.

13. A method according to claim 12 further comprising:
    responsive to receipt of the next association representation from an adjacent distal cell and to the prior association representation being active, decrementing the measure of the next association representation that was received and sending the measure of the next association representation that was decremented to the adjacent proximal cell and/or responsive to receipt of the measure of the prior association representation from an adjacent proximal cell and to the next association representation being active, decrementing the measure of the prior association representation that was received and sending the measure of the prior association representation that was decremented to the adjacent distal cell.

14. A method according to claim 13 further comprising:
    responsive to receipt of the measure of the next association representation from an adjacent distal cell and to the prior association representation being inactive, sending the measure of the association representation that was received to the adjacent proximal cell and/or responsive to receipt of the measure of the prior association representation from an adjacent proximal cell and to the next association representation being inactive, sending the measure of the prior association representation that was received to the adjacent distal cell.

15. A method according to claim 12 wherein repeatedly swapping is followed by:
    extracting bands from the series that has been swapped based on projections.

16. A method according to claim 15 wherein the projections comprise maximal projections, fixed length projections and/or longest nonmaximal projections.

17. A method according to claim 15 wherein repeatedly swapping and extracting bands are performed prior to loading and/or after loading.

18. A method according to claim 12 wherein the prior association representation and the measure of the prior association representation comprise prior association weights and the next association representation and the measure of the next association representation comprise next association weights.

19. A method according to claim 12 wherein the prior association representation comprises a prior association vector, the next association representation comprises a next association vector, the measure of the prior association representation comprises a pointer and the measure of next association representation comprises a pointer.

20. A method according to claim 12 wherein the prior association representation and the measure of the prior association representation comprise segments of prior associations and the next association representation and the measure of the next association representation comprise segments of next associations.

21. A method according to claim 12 further comprising:
    accumulating the associative counts.

22. A method according to claim 12 wherein activating selected sensor inputs to determine associations therebetween is repeatedly performed on the associative memory in a pipelined manner.

23. An associative memory comprising:
a plurality of associative memory cells, a respective cell including a sensor input, a prior association representation, a next association representation and an associative output, the plurality of cells being serially connected to form a linear array, such that the sensor inputs, the prior association representations and the next association representations of the serially connected cells are arranged in a sequence from distal to proximal cells based on affinities of associations among the sensor inputs,
wherein the affinities of associations among the sensor inputs are determined by repeatedly swapping inputs, prior association representations and next association representations in the series based upon affinities of associations in the proximal and distal directions.

24. An associative memory according to claim 23 wherein the affinities of associations among the sensor inputs are further determined by extracting bands from the series that has been repeatedly swapped, based on projections.

25. An associative memory according to claim 24 wherein the projections comprise maximal projections, fixed length projections and/or longest nonmaximal projections.

26. An associative memory according to claim 23 wherein the prior association representation and the measure of the prior association representation comprise prior association weights, and the next association representation and the measure of the next association representation comprise next association weights.

27. An associative memory according to claim 23 wherein the prior association representation comprises a prior association vector, the next association representation comprises a next association vector, the measure of the prior association representation comprises a pointer and the measure of next association representation comprises a pointer.

28. An associative memory according to claim 23 wherein the prior association representation and the measure of the prior association representation comprise segments of prior associations, and the next association representation and the measure of the next association representation comprise segments of next associations.

29. A method of determining associations using an associative memory that comprises a plurality of associative memory cells that are serially connected in a sequence from distal to proximal memory cells to form a linear array of a series of memory cells, the method comprising:
loading into a respective memory cell a prior association representation and a next association representation for a respective sensor input of the memory cell wherein the sensor inputs, the prior association representations and the next association representations of the serially connected cells are arranged in a sequence from distal to proximal cells based on affinities of associations among the sensor inputs;
activating selected sensor inputs to determine associations therebetween; and
repeatedly swapping inputs, prior association representations and next association representations in the series of memory cells based upon affinities of associations in the proximal and distal directions to determine the affinities of associations among ones of the sensor inputs.

30. A method according to claim 29 wherein repeatedly swapping is followed by:
extracting bands from the inputs, prior association representations and next association representations in the series of memory cells that have been swapped based on projections.

31. A method according to claim 30 wherein the projections comprise maximal projections, fixed length projections and/or longest nonmaximal projections.

32. A method according to claim 30 wherein repeatedly swapping and extracting bands are performed prior to loading and/or after loading.

33. A method according to claim 29 wherein the prior association representation and the measure of the prior association representation comprise prior association weights and the next association representation and the measure of the next association representation comprise next association weights.

34. A method according to claim 29 wherein the prior association representation comprises a prior association vector, the next association representation comprises a next association vector, the measure of the prior association representation comprises a pointer and the measure of next association representation comprises a pointer.

35. A method according to claim 29 wherein the prior association representation and the measure of the prior association representation comprise segments of prior associations and the next association representation and the measure of the next association representations comprise segments of next associations.

* * * * *

UNITED STATES PATENT AND TRADEMARK OFFICE
CERTIFICATE OF CORRECTION

PATENT NO.        : 7,657,496 B2
APPLICATION NO.   : 11/426520
DATED             : February 2, 2010
INVENTOR(S)       : Aparicio, IV Page 1 of 1

It is certified that error appears in the above-identified patent and that said Letters Patent is hereby corrected as shown below:

Title Page 2: OTHER PUBLICATIONS:
Left Column, Line 16, "Boahen": Please correct "Neurornorphic"
to read -- Neuromorphic --

Specification:
Column 1, Line 8: Please correct "FAS750-05-C-0125"
to read -- FA8750-05-C-0125 --

Signed and Sealed this

Twentieth Day of April, 2010

David J. Kappos
*Director of the United States Patent and Trademark Office*